(12) United States Patent
Leung et al.

(10) Patent No.: US 11,058,034 B2
(45) Date of Patent: Jul. 6, 2021

(54) MODULAR NETWORK SWITCH

(71) Applicant: Facebook, Inc., Menlo Park, CA (US)

(72) Inventors: Che Kin Leung, Fremont, CA (US);
Zhiping Yao, Santa Clara, CA (US);
Xu Wang, Fremont, CA (US); Lingjun Wu, San Jose, CA (US); John Edward Fernandes, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/676,887

(22) Filed: Nov. 7, 2019

(65) Prior Publication Data

US 2020/0077544 A1   Mar. 5, 2020

Related U.S. Application Data

(63) Continuation of application No. 16/100,759, filed on Aug. 10, 2018, now Pat. No. 10,568,238.

(51) Int. Cl.
| | |
|---|---|
| *H05K 7/20* | (2006.01) |
| *H05K 7/14* | (2006.01) |
| *G06F 1/18* | (2006.01) |
| *G06F 1/20* | (2006.01) |
| *H04L 12/931* | (2013.01) |

(52) U.S. Cl.
CPC ......... *H05K 7/20736* (2013.01); *G06F 1/181* (2013.01); *G06F 1/185* (2013.01); *G06F 1/189* (2013.01); *G06F 1/20* (2013.01); *H04L 49/405* (2013.01); *H05K 7/1489* (2013.01); *H05K 7/1492* (2013.01)

(58) Field of Classification Search
CPC .................. H05K 7/20563–20572; H05K 7/20727–20736
See application file for complete search history.

(56) References Cited

U.S. PATENT DOCUMENTS

| | | | |
|---|---|---|---|
| 6,424,523 B1 * | 7/2002 | Curtis .................. | G11B 33/126 312/331 |
| 6,650,533 B2 * | 11/2003 | Curtis .................. | G11B 33/126 312/331 |

(Continued)

FOREIGN PATENT DOCUMENTS

| | | | | |
|---|---|---|---|---|
| CN | 105487619 A | * | 4/2016 | ........... H05K 7/1457 |
| GB | 2445170 | | 7/2008 | |
| WO | WO-2017170153 A1 | * | 10/2017 | ........... F28D 15/025 |

*Primary Examiner* — Robert J Hoffberg
(74) *Attorney, Agent, or Firm* — Van Pelt, Yi & James LLP

(57) ABSTRACT

A modular network switch is disclosed. In an embodiment, removable interface modules and a switch circuit board (SMB) are housed in a chassis. Each of the interface modules includes a circuit board that is positioned in parallel with other interface modules. The SMB is oriented in a plane perpendicular to orientation planes of the interface modules, and the circuit boards are connected to the switch circuit board. A switch chip is electrically connected to SMB, and configured to switch network traffic between network connections of the interface modules. The chassis may include airflow regions separated by a divider with respective air intake vents. A power supply is housed in one of the regions and the SMB/interface modules are housed in another region. Power supplies provide power to the interface modules via a bus bar and provide power to the switch circuit board via a connection separate from the bus bar.

15 Claims, 24 Drawing Sheets

(56) References Cited

U.S. PATENT DOCUMENTS

| | | | | |
|---|---|---|---|---|
| 6,728,099 | B1 * | 4/2004 | Tsang | H05K 7/20727 361/678 |
| 7,102,887 | B2 * | 9/2006 | Blackwell | H05K 7/1457 361/690 |
| 7,344,439 | B2 | 3/2008 | Henry | |
| 7,549,917 | B2 | 6/2009 | Henry | |
| 8,345,425 | B2 * | 1/2013 | Toyoda | F28D 1/05366 361/700 |
| 8,456,859 | B2 * | 6/2013 | Dahlfort | H04Q 1/15 361/796 |
| 9,297,589 | B2 * | 3/2016 | Sakamoto | H01L 23/427 |
| 9,532,471 | B2 * | 12/2016 | Wang | H05K 1/14 |
| 9,538,685 | B2 | 1/2017 | Yu | |
| 9,549,470 | B2 * | 1/2017 | Blier | G02B 6/4246 |
| 9,552,025 | B2 * | 1/2017 | Samadiani | H05K 7/20318 |
| 9,854,697 | B2 | 12/2017 | Schmidtke | |
| 9,869,519 | B2 * | 1/2018 | Rice | F28F 1/40 |
| 9,888,605 | B2 * | 2/2018 | Xu | H01R 12/737 |
| 9,949,409 | B2 | 4/2018 | Schmidtke | |
| 9,961,803 | B2 * | 5/2018 | Samadiani | H05K 7/20809 |
| 9,970,713 | B2 * | 5/2018 | Rice | B23P 15/26 |
| 10,016,860 | B2 * | 7/2018 | Rice | B23P 15/26 |
| 10,028,417 | B2 | 7/2018 | Schmidtke | |
| 10,084,255 | B2 * | 9/2018 | Wang | H05K 5/0065 |
| 10,135,211 | B2 | 11/2018 | Lloyd | |
| 10,165,709 | B2 | 12/2018 | Schmidtke | |
| 10,271,461 | B2 | 4/2019 | Schmidtke | |
| 10,356,955 | B2 | 7/2019 | Schmidtke | |
| 10,372,177 | B2 * | 8/2019 | Kurosaki | H05K 7/20181 |
| 10,542,641 | B2 * | 1/2020 | Samadiani | G06F 1/20 |
| 10,568,238 | B1 * | 2/2020 | Leung | G06F 1/185 |
| 10,612,861 | B2 * | 4/2020 | Rice | H05K 7/20809 |
| 10,841,246 | B2 * | 11/2020 | Bechtolsheim | H05K 7/1451 |
| 2007/0211430 | A1 * | 9/2007 | Bechtolsheim | H05K 7/20736 361/695 |
| 2008/0259555 | A1 | 10/2008 | Bechtolsheim | |
| 2012/0120596 | A1 | 5/2012 | Bechtolsheim | |
| 2014/0090814 | A1 * | 4/2014 | Kondou | H01L 23/427 165/104.21 |
| 2014/0345829 | A1 * | 11/2014 | Kang | H01L 23/427 165/104.21 |
| 2017/0332519 | A1 | 11/2017 | Schmidtke | |
| 2018/0260006 | A1 * | 9/2018 | Kurosaki | G06F 1/20 |
| 2018/0366890 | A1 | 12/2018 | Lloyd | |
| 2019/0074667 | A1 | 3/2019 | Huang | |
| 2019/0081911 | A1 * | 3/2019 | Leung | H04L 49/40 |
| 2019/0113287 | A1 * | 4/2019 | Hachiya | H05K 7/20672 |

\* cited by examiner

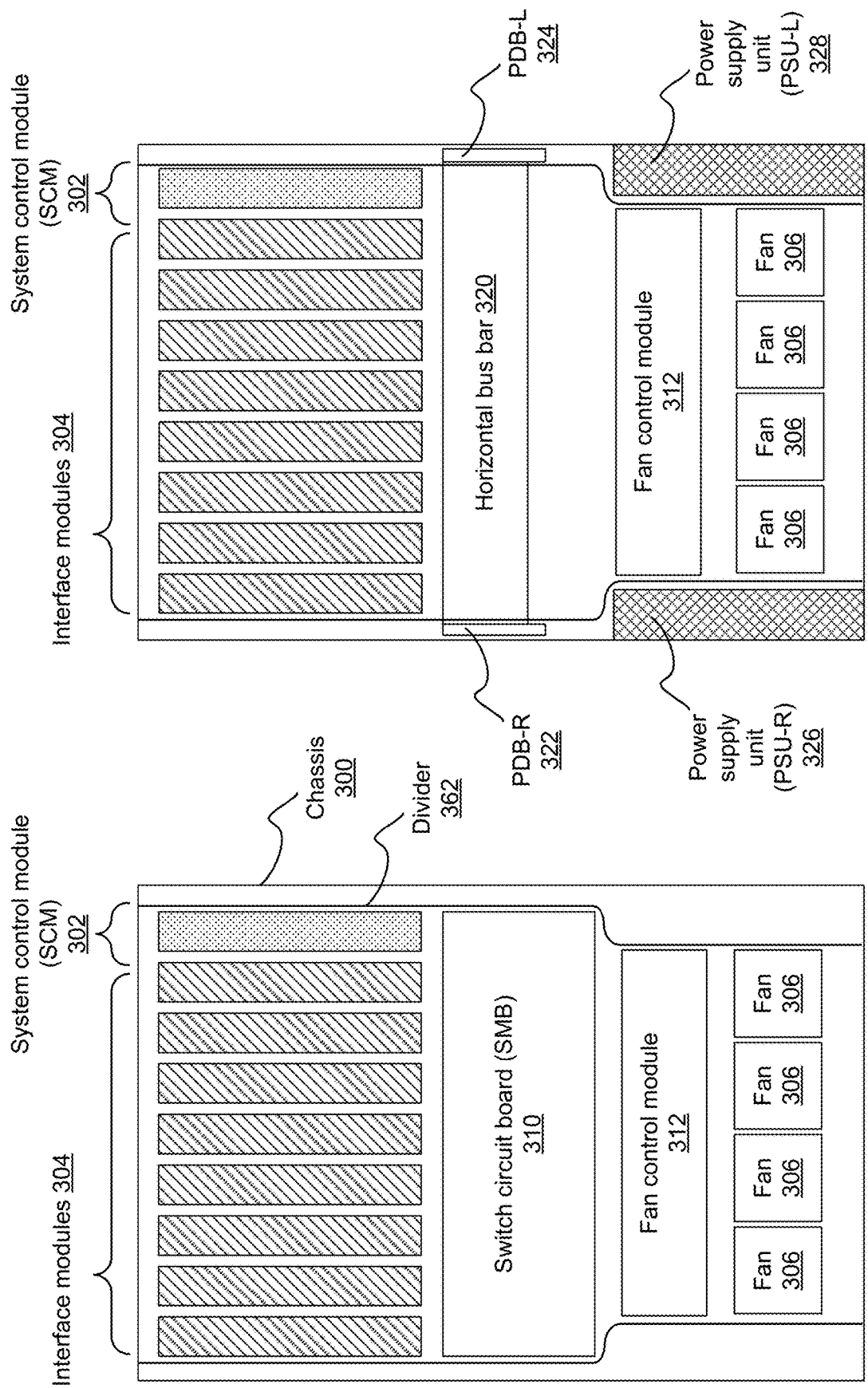

MODULAR NETWORK SWITCH

CROSS REFERENCE TO OTHER APPLICATIONS

This application is a continuation of U.S. patent application Ser. No. 16/100,759, now U.S. Pat. No. 10,568,238, entitled MODULAR NETWORK SWITCH filed Aug. 10, 2018 which is incorporated herein by reference for all purposes.

BACKGROUND OF THE INVENTION

Network switches connect devices together in a computer network. Network switches are typically used in data networking environments to, for example, interconnect various devices within one or more subnetworks. Network switches receive, process, and forward data to destination devices. Switches can be used for electrical switching, optical switching, or a combination of electrical and optical switching.

BRIEF DESCRIPTION OF THE DRAWINGS

Various embodiments of the invention are disclosed in the following detailed description and the accompanying drawings.

FIG. 3A is a top-down view of a modular network switch according to an embodiment.

FIG. 3B is a top-down view of a modular network switch according to an embodiment.

DETAILED DESCRIPTION

Figure 1:
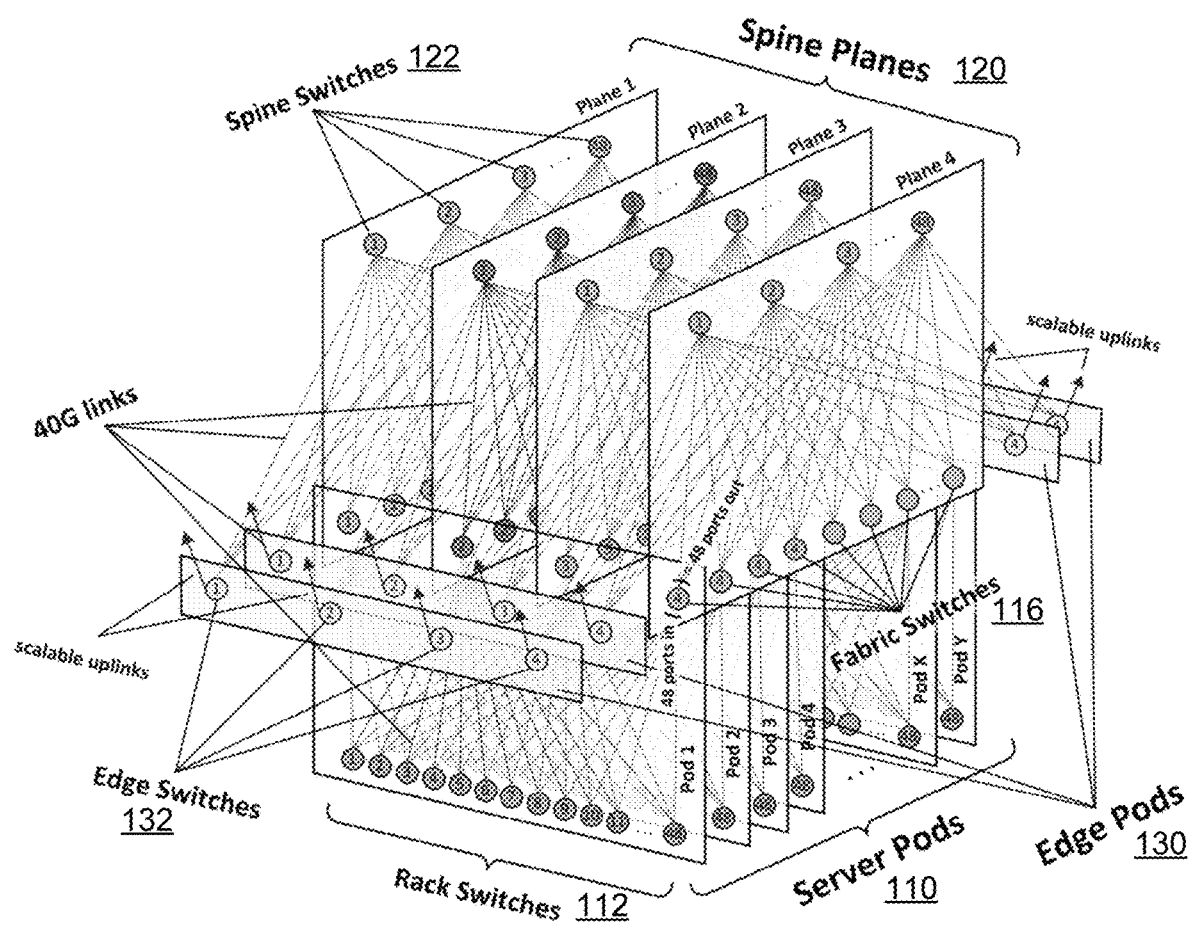
FIG. 1 shows an example of a data center network topology in which a vertical connection interface sideplane can be utilized.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A modular network switch is disclosed. The modular network switch is a network switch with modular replaceable network switch interface modules (e.g., interface cards such as line cards, fabric cards, control modules, etc.). The modular network switch supports a variety of card configurations including four cards to 16 cards. The modular network switch includes a device chassis with a cooling system in which cooling air channels for a main system and a power supply are separated. The modular network switch has a power distribution bus bar that is separate from a power connection to a main system board. The network switch interface modules are oriented parallel to the flow of cooling air through the chassis. Unlike conventional systems, the network switch here does not include a backplane, which runs along the back of the chassis behind the interface modules, or midplanes, which run perpendicular to interface modules. The absence of backplanes or midplanes provides a more direct air flow path through the chassis, thereby enabling a more efficient flow of cooling air and lower operating temperatures. In some embodiments, the chassis includes a structural assembly (without circuitry) that may improve structural integrity of the chassis running perpendicular interface modules such as a metal structural piece with holes promoting airflow.

The modular network switch finds application in a variety of computer networks. The following figures shows an example of a computer network with several types of logical switches, each of which may be implemented by the modular network switch disclosed here.

FIG. 1 shows an example of a data center network topology in which a vertical connection interface sideplane can be utilized. Unlike conventional data centers that use large devices and clusters connected together in a large mesh, the network here is disaggregated in the sense that smaller identical network units (e.g., server pods 110) are used and interconnected using various different network planes. The server pods are communicatively coupled to each other, e.g., by high-performance links.

In various embodiments, a server pod is a standard "unit of network," and functions as a logical switch. Each server pod includes fabric switches 116 and rack switches 112 (sometimes called top of rack or TOR switches). In this example, each pod is served by a set of four fabric switches for a 3+1 four-post architecture for server rack TOR uplinks, where each TOR has 4×40G uplinks, providing a total of 160G bandwidth capacity for a rack of 10G-connected servers. A server pod may be much smaller than a unit of network in a conventional data center, e.g., the server pod here has 24 server racks. This size may be advantageous because most basic mid-size switches can service the pods. A relatively smaller port density of fabric switches makes the internal architecture simple, modular, and robust. In some embodiments, for each downlink port to a TOR, an approximately equal amount of uplink capacity is reserved, allowing network performance to be scaled up to statistically non-blocking.

In FIG. 1, there are four spine planes 120, which are independent planes of spine switches 122. In this example, each spine plane is scalable up to 48 independent devices within the plane. Each fabric switch of each pod connects to each spine switch within its local plane. Together, the pods and planes form a modular network topology capable of accommodating hundreds of thousands of 10G-connected servers.

External connectivity (e.g., to external network) is provided by edge pods 130, which has edge switches 132 to which deliver data to the backbone and to back-end internal fabrics. For example, the edge pods can provide around 7.68 Tbps to the backbone and is callable to 100G and higher port speeds within the same device form factors. The network topology is scalable. In this regard, the number of fabric switches and rack switches can be increased or decreased to meet performance goals. Server pods can be added to provide more compute capacity, spine switches can be added for more intra-fabric network capacity, and edge pods or scale uplinks can be added for more extra-fabric connectivity. Therefore, compared with conventional data center networks, processing is improved and client requests are serviced in a more efficient manner.

The number, placement, and capacity of planes, switches, and links shown here are merely exemplary and not intended to be limiting. One or more of the switches (e.g., spine switches, fabric switches, and edge switches) can be implemented using a plurality of physical component switches that together form a single logical switch. A single logical switch can be implemented by the modular network switch described herein. The modular network switch has a unique cooling channel and power distribution system that improves the functioning of the switch, and, consequently the functioning of a computer network in which the switch is used. The following figures show an example of a modular network switch.

Figure 2A:
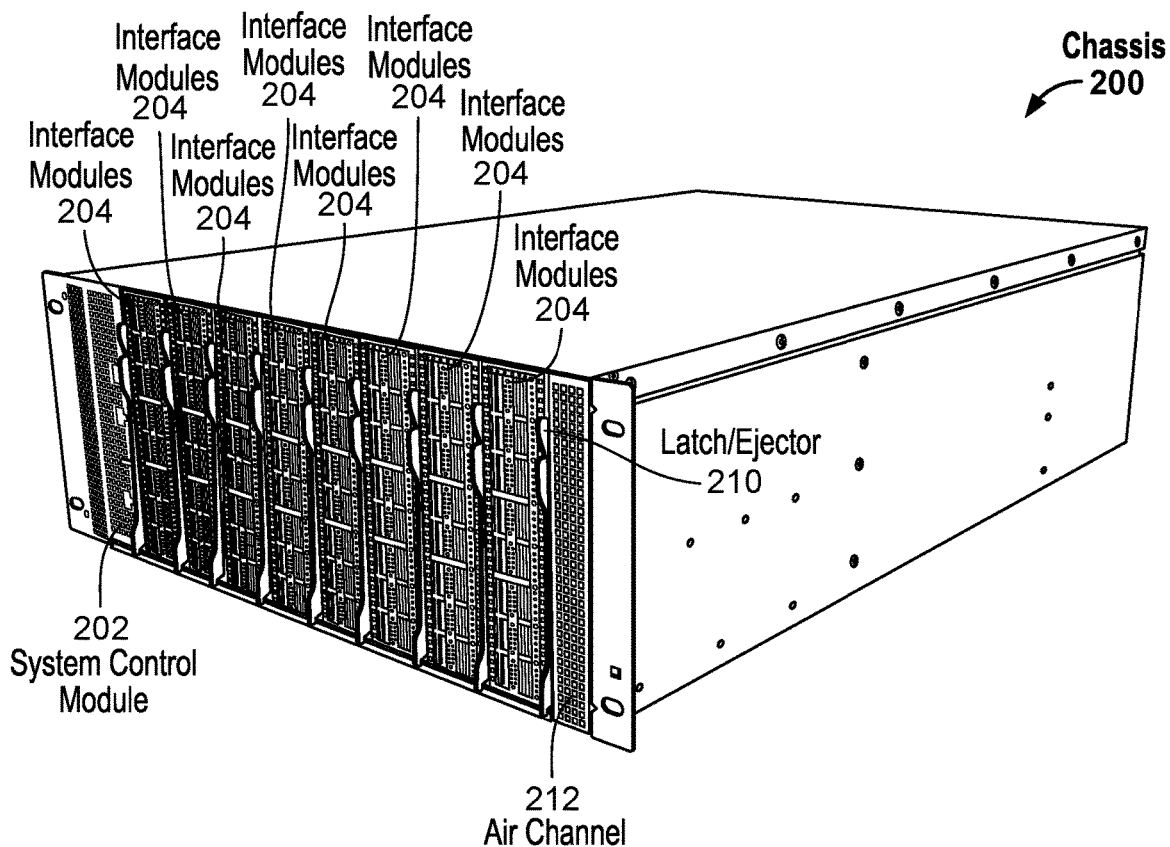
FIG. 2A is a front perspective view of a modular network switch according to an embodiment.

FIG. 2A is a front perspective view of a modular network switch according to an embodiment. The modular network switch includes a device chassis 200, which can be mounted on a network rack. Device chassis 200 is adapted to house modular removable components. Here, there are two types of modular removable components: system control module 202 and network switch interface modules 204 (sometimes simply called "interface module" or "port interface module (PIM)").

Interface modules 204 are configured to provide switching operations. For example, an interface module receives data packets and forwards the data packets to the appropriate destination. As further described with respect to FIG. 4, an interface receives an optical signal, converts the signal to a signal for a switch chip, and sends the signal to the switch chip, to then route the signal to a destination. System control module 202 is a processing unit configured to manage the interface modules. For example, networking policies, temperature control, power distribution, and the like can be managed by the system control module.

In a conventional network switch, upgrading or repairing a CPU or interface modules typically requires disassembling the chassis (opening a chassis, unscrewing or unsoldering components, etc.). As CPU and network interface technology advances at a swift pace and standards change, the relatively frequent removal of a CPU such as system control module and the interface modules can be time consuming and tedious. By contrast, according to the techniques disclosed here, one or more CPUs (or GPUs or other processing unit) and interface modules are positioned near the front of the chassis on independent circuit boards so that they can be easily replaced or upgraded while the other components of the network switch remain in place.

In another aspect, typically circuit boards are interconnected via a backplane or mid-plane circuit boards in a chassis for a conventional network switch. The backplane or mid-plane is typically perpendicular to the flow of cooling air through the chassis and can impede the flow of air, thus decreasing the efficiency of cooling elements in the chassis. Embodiments of the modular network switch disclosed do not require a backplane or mid-plane. The interface modules and other internal components may be oriented parallel to a flow of cooling air through the chassis resulting in lower component operating temperatures than conventional switches. For example, removable network switch interface modules are housed in the chassis, where each of the removable network switch interface modules includes a circuit board with associated switch circuitry. Each circuit board is positioned in parallel with other network switch interface module circuit boards of the other removable network switch interface modules housed in the chassis. This positioning is advantageous because air can enter the front of the chassis, flow over the interface modules and system control module to cool the components in the chassis. An example air channel 212 is shown.

The modular network switch supports a variety of card configurations. In this example, there are 8 slots on one end of the chassis adapted to receive 16 interface modules, e.g., 16×QSFP28 100G cards.

In some embodiments, a latching/ejecting apparatus is provided in the network switch for quickly and easily securing switch components (e.g., interface modules, etc.) in a chassis or other enclosure, and easily removing the components for upgrade of replacement. Latch 210 is an example of a latch associated with an interface module of the network switch. A variety of latching (ejecting) mechanisms can be used. For example, a first latch mounted on one side of an interface module cooperates with a second latch mounted on an opposite of the interface module. The latches can be mirror images of each other and be used to install and retain the interface module in position within the chassis. As another example, the latch can be integrated with a handle. When the interface module is fully installed, the handle can be locked in a closed position by means of a locking feature on the handle that releasably engages a bracket fixedly attached to a face panel of the interface module. To remove the interface module, a user can depress an ejector in the form of a button or lever, which automatically rotates the handle away from the cabinet to disengage the latch from a rail and partially eject the interface module, allowing the user to easily withdraw the interface module from the chassis.

Figure 2B:
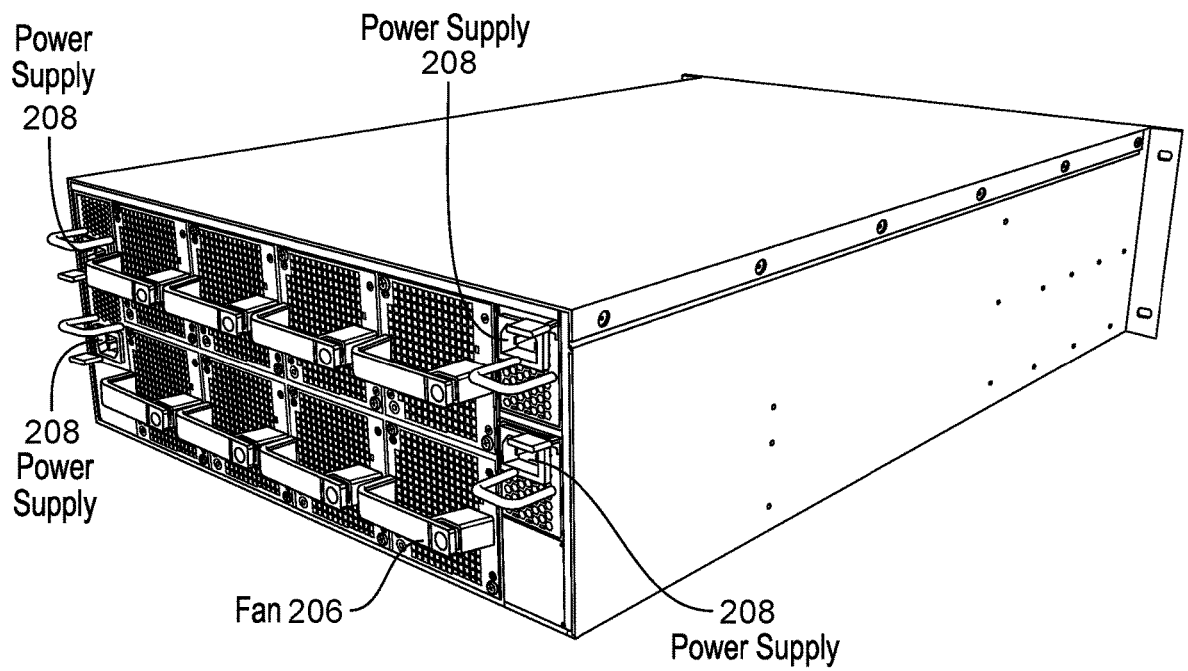
FIG. 2B is a back perspective view of a modular network switch according to an embodiment.

FIG. 2B is a back perspective view of a modular network switch according to an embodiment. In addition to housing other components, device chassis 200 houses one or more fans 206. In this example, there are 8 fan trays, although only one of them is labeled for simplicity. The fan trays, along with possibly other cooling components, provide cooling for the modular network switch to improve the performance of the switch by maintaining an optimal operating temperature for the interface modules, interface module circuit board, switch circuit, board, switch chips, and other devices of the modular network switch. The fan trays can be sized based on a chassis size, and quantity of cooling to be provided, among other things. For example, a fan tray can be 80 mm square.

Figure 19:
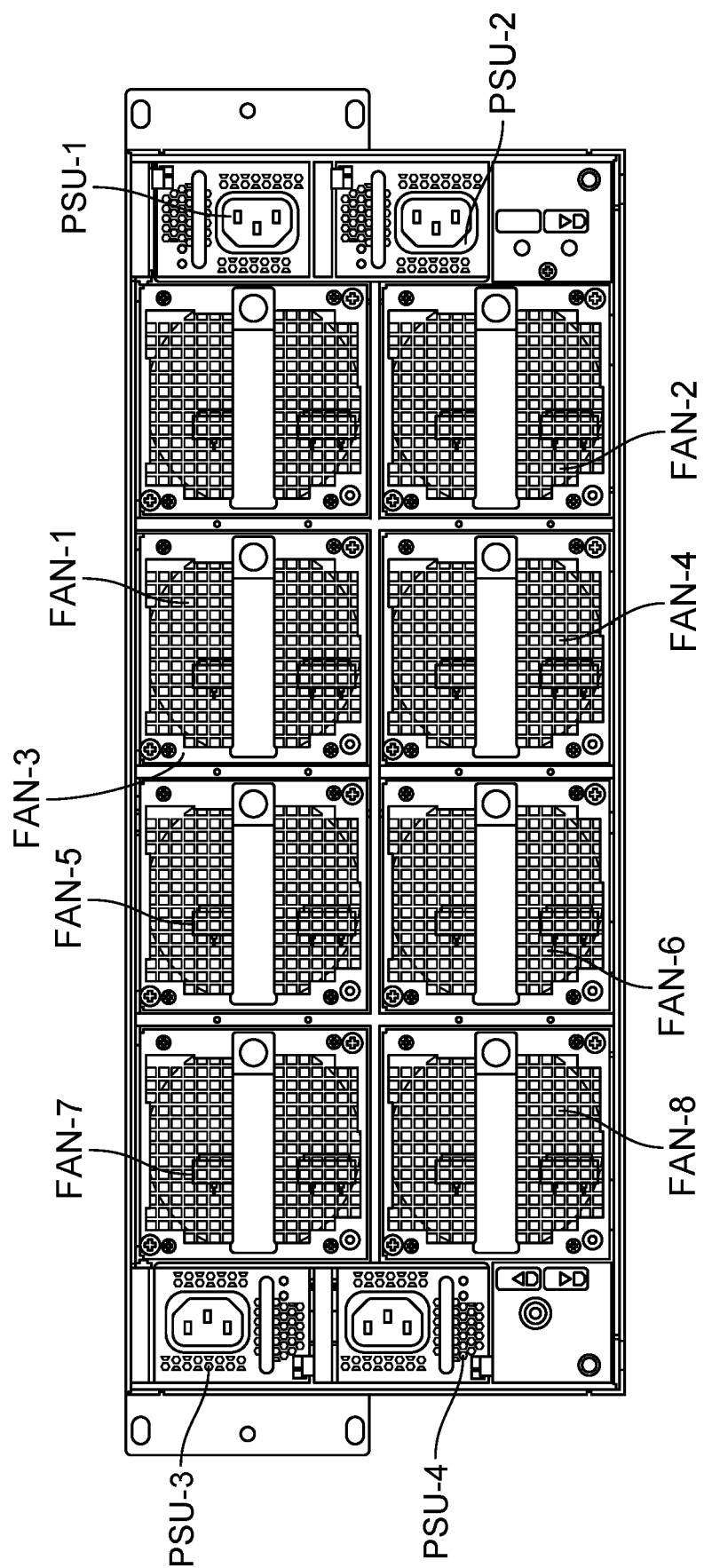
FIG. 19 is a back view of a modular network switch showing example locations of cooling components and power supplies according to an embodiment.

A cooling system for the modular network switch is further described with respect to FIG. 19.

The power supplies and fans are modular, removable, and replaceable. As shown, they each have handles facilitating separate removal from their respective receptacles in the chassis. This allows each component to be repaired or replaced individually without disturbing the functioning of the other components or the functioning of the network switch as a whole.

FIG. 3A is a top-down view of a modular network switch according to an embodiment. The modular network switch includes interface modules 304, system control module 302, switch circuit board 310, fan control module 312, and fans 306. Interface module 304 and fans 306 are like their counterparts described in FIGS. 2A and 2B.

System control module 302 is an example of another type of component that is removable from the chassis. It can include the same ejection mechanism as the interface modules, allowing the system control module (SCM) to also be easily removed or replaced. SCM 302 is configured to provide management functions for the network switch. For example, it can coordinate communications with switch circuit board 310, interface modules 304, and other components of the network switch. The functions of the SCM are further described with respect to FIG. 4.

Switch circuit board 310 is housed in device chassis 300 and oriented on an orientation plane perpendicular to orientation planes of the interface modules 304 and SCM 302. Each of the interface modules is connected to switch circuit board 310. The switch circuit board is sometimes called the switch main board (SMB). SMB 310 provides data plane functions using a switch circuit (further described with respect to FIG. 4) and management plane functions.

Fan control module 312 is adapted to control fans 306 to provide cooling to the chassis. The number and placement of fan control modules and fans is exemplary and not intended to be limiting. For example, in some embodiments, there are two fan control modules and eight fans. One of the fan control modules controls the top four fan trays, and the other fan control module controls the bottom four fan trays. A fan control module can include a fan status monitor and a device such as a complex programmable logic device (CPLD) for fan control. Fan control module 312 is communicatively coupled to switch circuit board 310, allowing switch circuit board 310 to send control signals to fan control module 312 dictating fan behavior such as regions within the chassis to cool.

Divider 362 isolates a power supply unit in a space on the left side of the chassis. Another divider (not labeled here) isolates another power supply unit in a space on the right side of the chassis. Air flows through the three regions created by the dividers to cool components in the respective regions as further described with respect to FIG. 3C.

FIG. 3B is a top-down view of a modular network switch according to an embodiment. Here, the switch circuit board has been removed to provide a better view of the power distribution system, which includes horizontal bus bar 320, right power distribution board (PDB-R) 322, left power distribution board (PDB-L) 324, right power supply unit (PSU-R) 326, and left power supply unit (PSU-L) 328. The modular network switch includes one or more power supplies 208. For example, four load-sharing power supply units form part of a power distribution system to deliver power to the components of the modular network switch such as the interface modules, interface module circuit board, switch circuit, board, switch chips. In various embodiments, the power supply provides power to the interface modules 304 via a power bus bar (formed by PDB-L, PDB-R, and horizontal bus bar), and the power supply provides power to the switch circuit board via a connection separate from the power bus bar. The power distribution system is further described with respect to FIG. 24. The other components shown in FIG. 3B are like their counterparts in FIG. 3A.

Figure 3C:
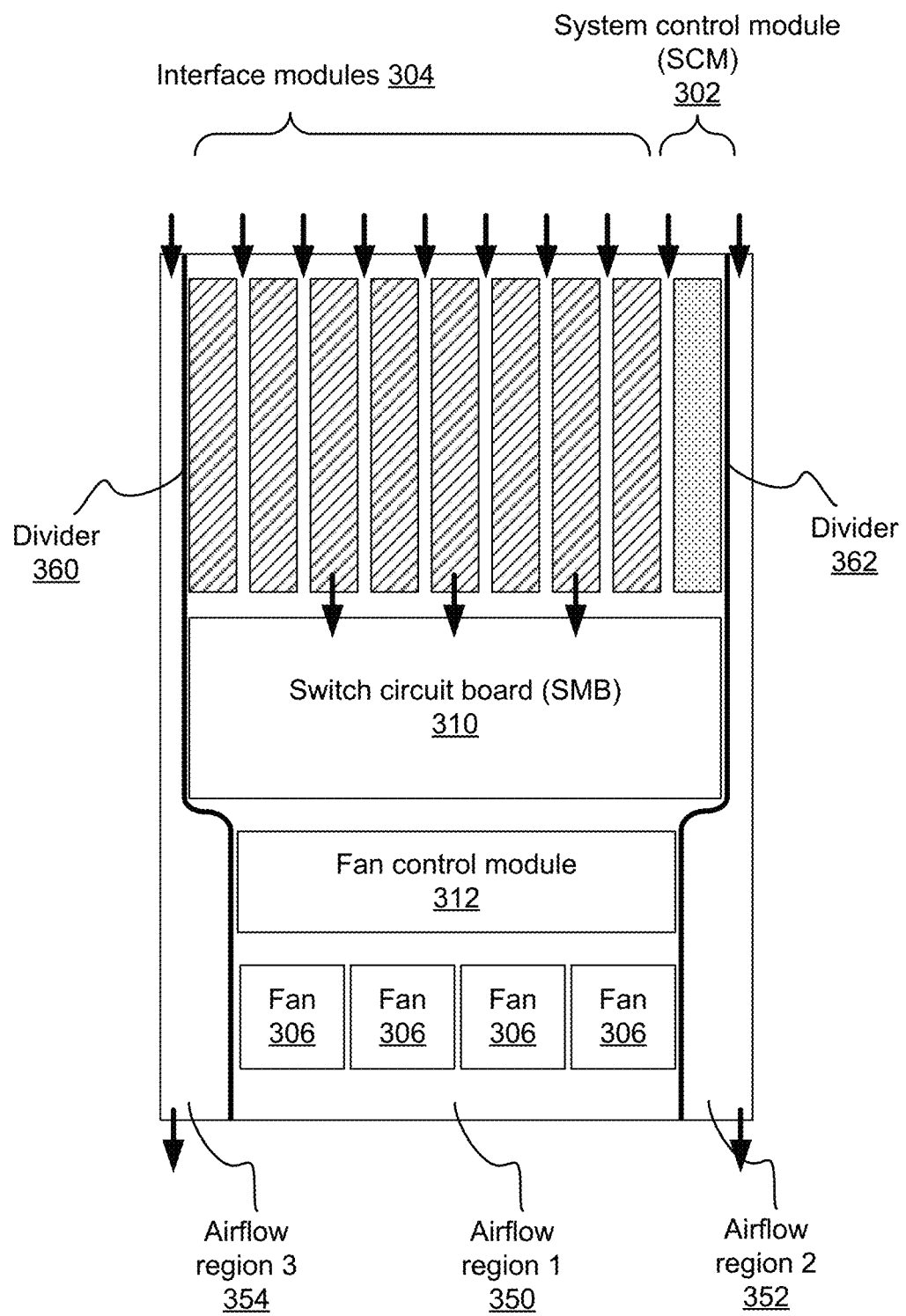
FIG. 3C is a top-down view of a modular network switch showing example airflow pathways according to an embodiment.

FIG. 3C is a top-down view of a modular network switch showing example airflow pathways according to an embodiment. Divider 360 isolates a power supply unit (e.g., PSU-R 326) in a space on the right side of the chassis. Divider 362 isolates a power supply unit (e.g., PSU-L) in a space on the left side of the chassis. For example, PSU-R is housed in the chassis in airflow region 3 and PSU-L is housed in the chassis in airflow region 2. The power supplies are divided from the rest of the chassis by the divider because the power supplies tend to generate heat when in operation. The heat can be dissipated via the air flow represented by the arrows. By isolating the power supplies form the other components such as the SCM and interface modules, those components are prevented from overheating due to the power supplies.

Figure 6:
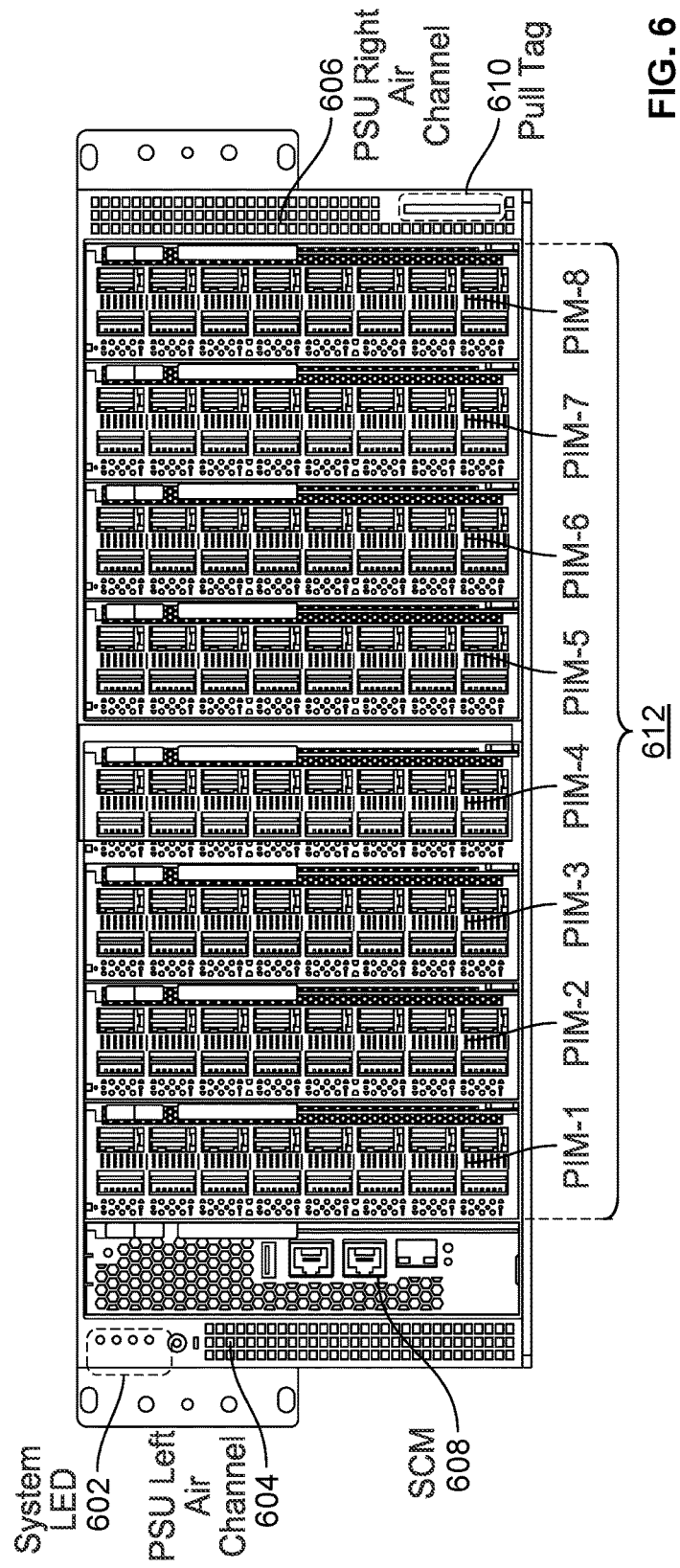
FIG. 6 is a front view of a 16Q version of a modular network switch according to an embodiment.

Air flows through the three regions created by the dividers to cool components in the respective regions. For example, air flow region 1 (350) is separated from airflow region 2 (352) by an airflow divider 362. Air flow region 1 (350) is separated from airflow region 3 (354) by airflow divider 360. Example air flow paths are indicated by the arrows. Referring to airflow region 2 (352), air enters from the front portion of the chassis, passes through region 1 over the power supply unit and exits from the rear of the chassis. Similarly, for airflow region 3 (354), air enters from the front portion of the chassis, passes through region 3 over the power supply unit and exits from the rear of the chassis. Airflow region 1 (350) is associated with a center of the chassis and most of the components (interface modules, SCM, and SMB). In some embodiments, each interface module includes an air intake vent. Referring to FIG. 6, which is a front view of a device chassis, each of the interface modules (PIM-1 to PIM-8) has a portion covered by a perforated cover, which is an example of an air intake vent. Each of airflow regions 2 and 3 may have a separate air intake vent that is different from the air intake vents of the interface modules. Referring again to FIG. 6, PSU left channel 604 is an example of a separate air intake vent for airflow region 2 and PSU right channel 606 is an example of a separate air intake vent for airflow region 3. In some embodiments, one or more fans 306 are actuated, causing air to be pulled in from the front portion of the chassis, flow over the interface modules, SCM, and SMB to cool those components, and the air exits from a rear of the chassis. Portions of the front of the chassis and the rear of the chassis such as the housing/walls can be made from a perforated material to promote airflow.

As shown, each of the interface modules 304 and the SCM 302 is positioned in parallel with the other network switch interface modules housed in the device chassis. This positioning is advantageous because air can enter the front of the chassis, flow over the interface modules and system control module to cool the components in the chassis. In the embodiment shown, there is no backplane (e.g., orthogonal to the interface modules), so airflow to the SMB is not blocked, and air is able to follow in the direction indicated by the arrows all the way through the chassis.

In some embodiments, a first airflow region in the chassis is for a switch circuit board and a second airflow region is for one or more power supplies. The two airflow regions are different from each other and may have separate air intake vents.

Figure 3D:
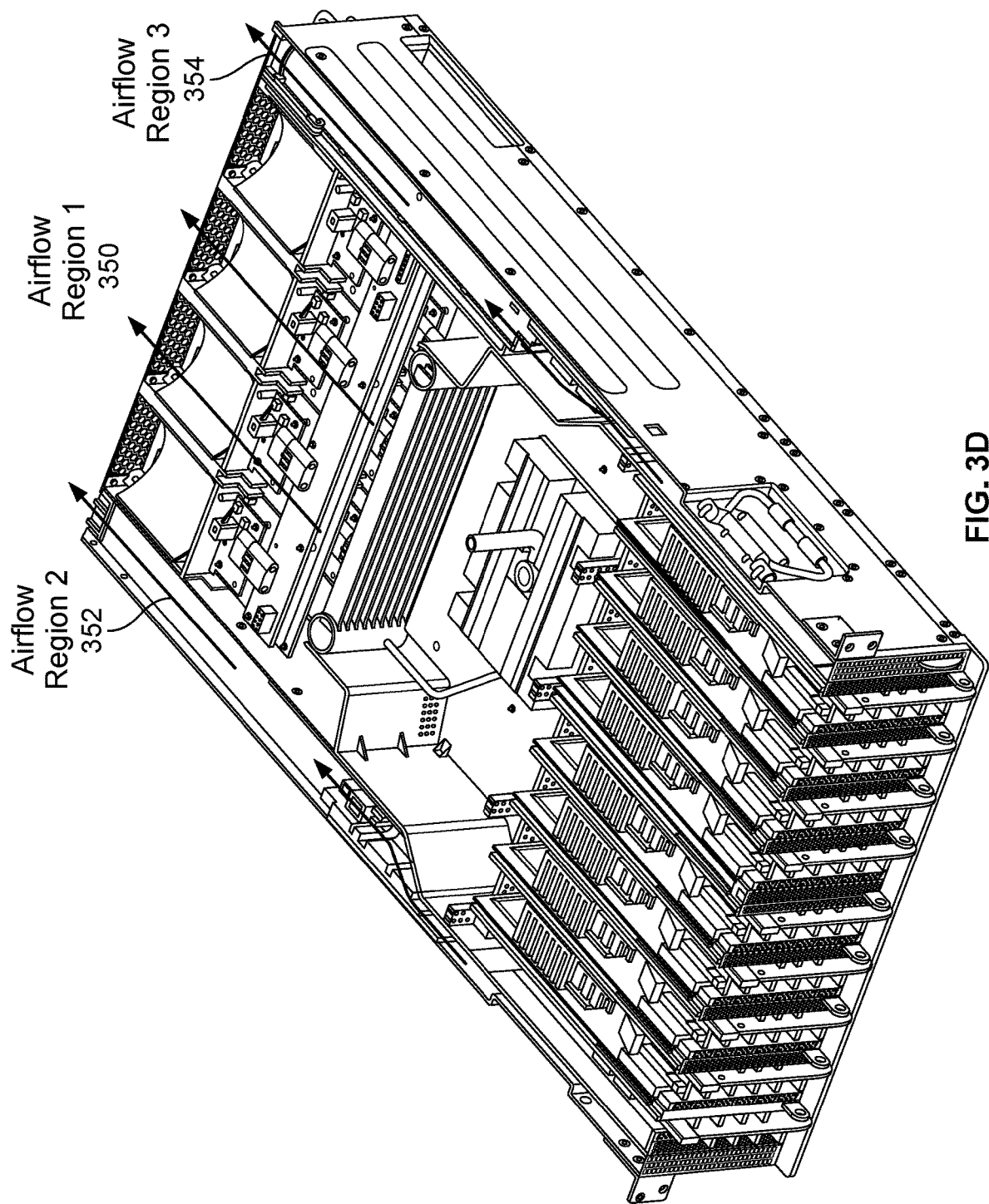
FIG. 3D is a perspective view of a modular network switch showing example airflow pathways according to an embodiment.

FIG. 3D is a perspective view of a modular network switch showing example airflow pathways according to an embodiment. Air flows through three regions created by the dividers to cool components in the respective regions. For example, air flow region 1 (350) is separated from airflow region 2 (352) by an airflow divider 362. Air flow region 1 (350) is separated from airflow region 3 (354) by airflow divider 360. Each of the air flow regions and other components shown in FIG. 3D are like their counterparts in FIGS. 3A-3C.

The previous figures show an example form factor of a modular network switch. The following figure is a corresponding block diagram of a modular network switch.

Figure 4:
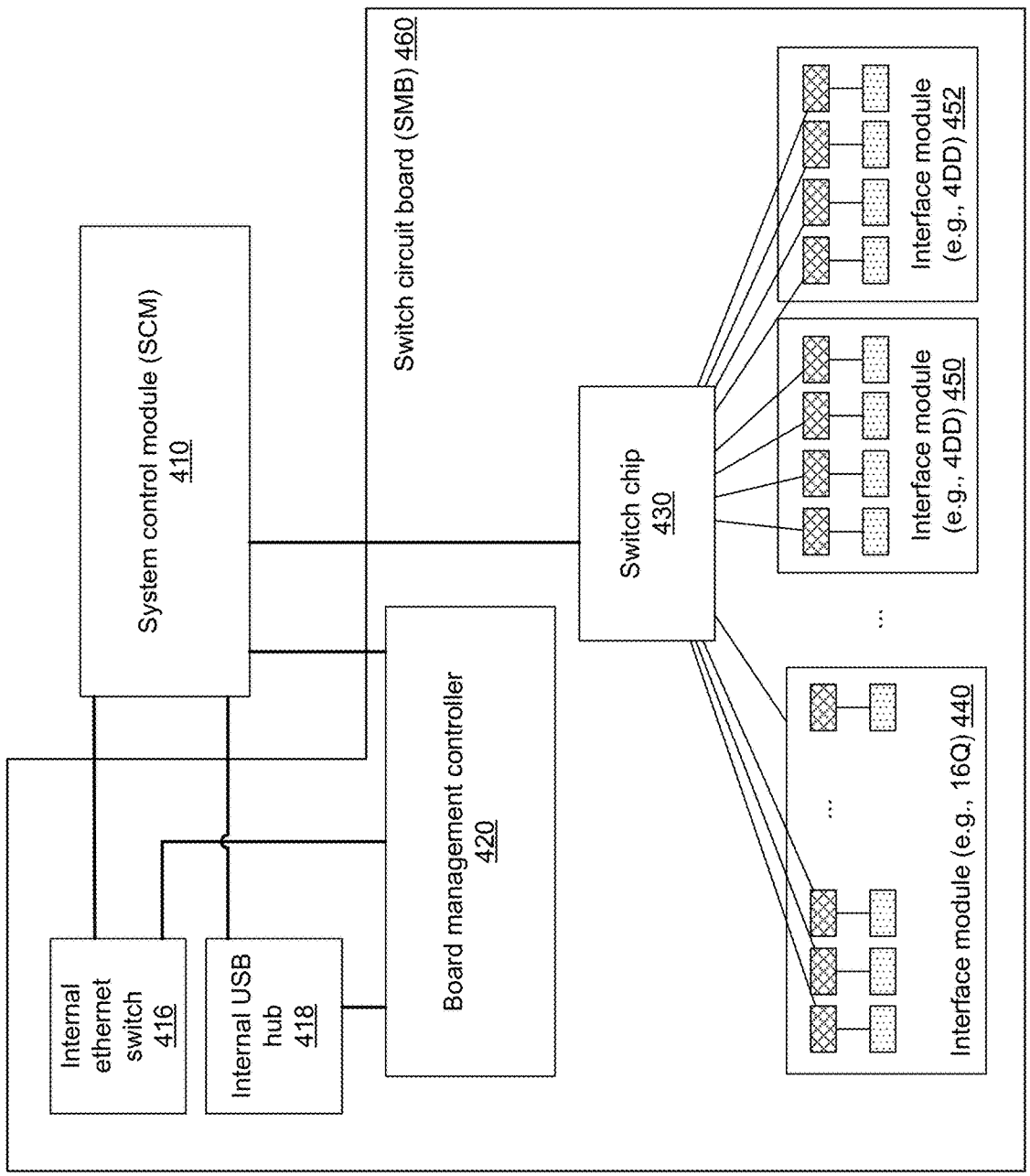
FIG. 4 is a block diagram illustrating an embodiment of a modular network switch system.

FIG. 4 is a block diagram illustrating an embodiment of a modular network switch system. This is an example of a single-switch network switch that has only one switch to handle all of the connections with interface modules. This system can be powered by one or more power supply units, and have one or more fan trays to cool the system. This block diagram shows the logical architecture of the network switch. The system includes system control module (SCM) 410 and switch circuit board (SMB) 460.

Figure 8:
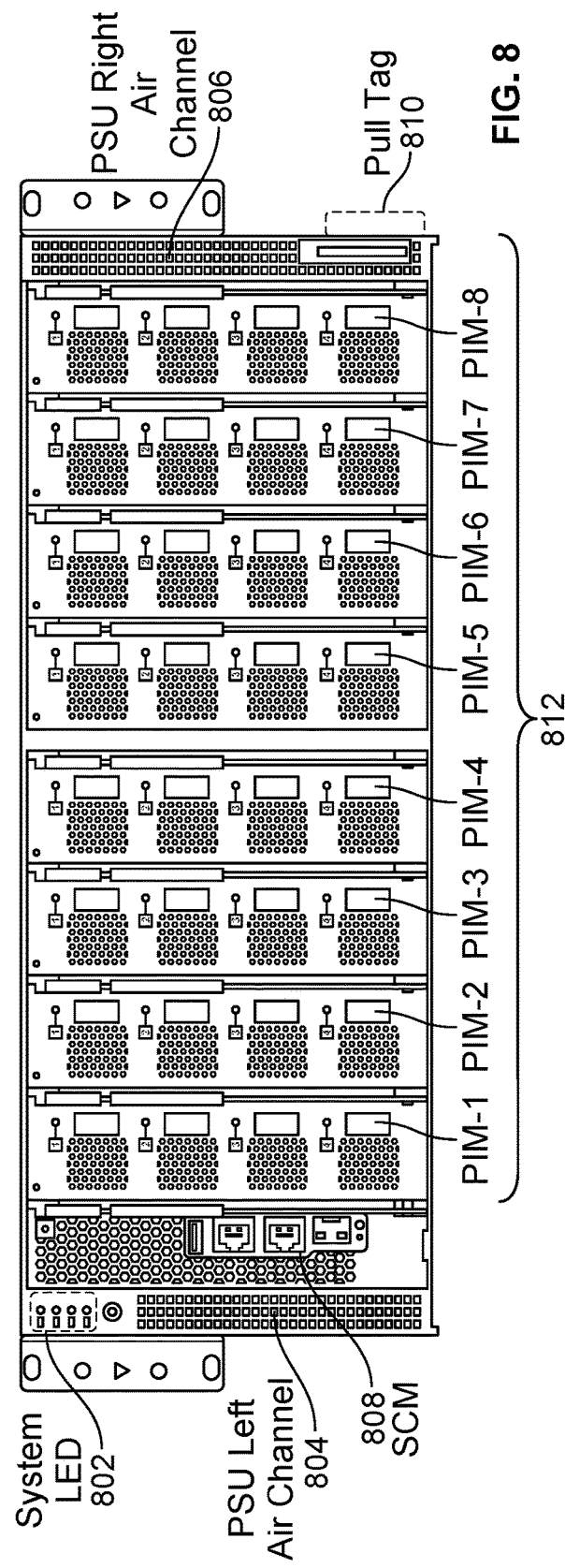
FIG. 8 is a front view of a 4DD version of a modular network switch according to an embodiment.

System control module 410 is configured to provide management and control of the modular network switch, e.g., communicating with switch chip 430 and other components. In some embodiments, the SCM includes a COM-express (COM-e) CPU module, which provides control functions of the network switch. The SCM can be plugged into a front panel of the chassis, parallel with the interface modules. An example of where the SCM is situated is shown in FIGS. 6 and 8. In some embodiments, system control module 410 includes an Ethernet port, and a USB (e.g., Type-A) port on the front panel. The USB port can be used for a debug dongle for example. In some embodiments, the SCM includes a hot swap controller supporting current, voltage, power, and temperature readback.

Switch circuit board 460 includes switch chip 430, board management controller (BMC) 420, and interface modules 440, 450, and 452. The switch circuit board provides data plane functions via switch chip 430 and management plane functions via the BMC 420. Switch circuit board 460 provides USB control functions for SCM 410 to access the interface modules in some embodiments.

Switch chip 430 is communicatively coupled to SCM 410 and subject to control of the SCM. Switch chip 430 is electrically connected to SMB 460, and configured to switch network traffic between network connections of the interface modules. Unlike typical network switches, which have several switch chip, the example here has a single switch chip. The switch chip can be any suitable chip capable of supporting the interface modules. For example, the Broadcom Tomahawk®3, capable of 12.8 Tbps or data transfer, would be suitable for 32×400G connections (the collective connections of the interface modules 440, 450, 452).

Interface modules 440, 450, and 452 provide network interface connectivity for the network switch. Each of the interface modules includes transceivers (shaded with dots) and gearbox network physical layer function chips (shaded with cross hatching). The transceivers use a variety of protocols such as Quad Small Form-factor Pluggable (QSFP), dense wavelength division multiplexing (DWDM), and the like. Optical receivers may include further types. Here, two types of optical receivers are described: a QSFP network switch, which has 16 slots supporting 100G per slot (called "16Q") and QSFP-DD network switch, which has 4 slots supporting 400G per slot (called "4DD"). Other configurations are also possible, such as 8×QSFP56 200G. In some embodiments, within a chassis, one or more types of network interfaces are used. For example, a chassis may include all network interfaces of the same type. As another example, a chassis may include more than one type of network interface. In this example, two types of network interfaces are provided in a single chassis: 16Q and 4DD. The modular, replaceable nature of the network interfaces allow them to be easily replaced, removed, and mingled in the same chassis. The gearbox chips translate the signal from switch chip 430 to the appropriate transceiver interface. For example, gearbox chips can be configured to convert signaling format, re-time, amplify, encrypt, decrypt signals, and the like. The gearbox chips may also support additional network protocols including Media Access Security (MACSec).

Interface module 440, which is an example of a 16Q interface module, has 16 QSFP28 ports, each port capable of supporting a 100G optic transceiver. Interface module 440 has one or more gearbox chips to translate the signal from switch chip 430 to the QSFP28 100G interface.

Each of interface modules 450 and 452, which is an example of a 4DD interface module, has 4 QSFP-DD ports, each port supporting a 400G optic transceiver. Interface module 450 has one or more gearbox chips to translate the signal from switch chip 430 to the QSFP-DD 400G interface.

In some embodiments, each interface module (regardless of type) has one or more temperature sensors to monitor temperature on the interface module. For example, one temperature sensor is in the front and another temperature sensor is in the rear of the interface module. Each interface module may have interfaces to communicate with BMC 420. For example, the board management controller may control or check the status of the QSFP modules. Power can be provided to the interface modules by a distribution system such as by horizontal bus bar 320 of FIG. 3B.

The components shown here may be coupled using a variety of communications protocols. For example, SCM 410 and switch chip 430 may communicate via PCIe, SCM 410 and board management controller 420 may communicate via USB and/or Ethernet. Here, an internal USB hub 418 and internal Ethernet switch 416 are shown. They facilitate respective communication types and may be implemented by off-the-shelf components. In some embodiments, the USB hub includes three ports to provide multiple USB connections to BMC 420 and other components, and one port may be reserved for debugging. These examples of communications protocols are not intended to be limiting.

In some embodiments, there are two management data input/output (MDIO) paths in the network system. A first path runs from a COM-e CPU on system control module 410 to switch chip 430 to a gearbox of an interface module 440, 450, 452. A second path runs from a COM-e CPU on system control module 410 to an input/output block (JOB) of system control module 410 to an FPGA on the interface module 440, 450, 452 to a gearbox of the interface module. The second path is not typically found in conventional network switches.

In this example, there are two types of interface modules. The first type, "16Q" is further described in FIGS. 5 and 6. The second type, "4DD" is further described in FIGS. 7 and 8.

Figure 5:
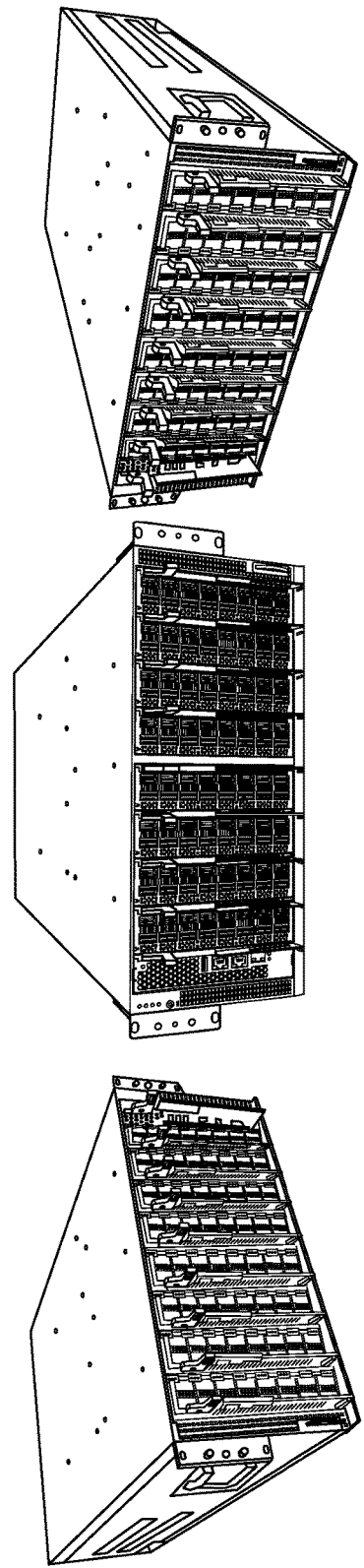
FIG. 5 is perspective view of a 16Q version of a modular network switch according to an embodiment.

FIG. 5 is perspective view of a 16Q version of a modular network switch according to an embodiment. Here, three perspective views of a modular network switch are shown. The network switch corresponds to the one described in FIGS. 2A and 2B. The view is of the front of the chassis, showing 8 interface modules. Each interface module supports QSFP28 100G.

FIG. 6 is a front view of a 16Q version of a modular network switch according to an embodiment. As shown, there are 8 interface modules: they are labeled PIM-1 (port interface module) to PIM-8. Each of the interface modules 612 have ejectors to facilitate removal. On the left side of the chassis, there is a system LED 602 to display various signals about the performance of the network switch components. For example, four tri-color system LEDs can be programmed to display status information about the system, the power distribution system, the fan, and the switch circuit board (SMB). One LED can be provided for each of the four examples listed above. System control module (SCM) 608 is configured to control the network switch, as more fully described with respect to FIG. 4.

Each side of the chassis has an air channel (air channel 604 and 606). PSU left air channel 604 and PSU right air channel 606 have perforated covers in this example. The covers cover a channel above a left PSU for cooling the left PSU corresponding to PSU-L 328 of FIG. 3 and a channel above a right PSU for cooling the right PSU corresponding to PSU-R 326 of FIG. 3. Pull tag 610 can be actuated to remove a cover of the chassis.

FIGS. 5 and 6 show examples of one type of modular network switch (16Q). They correspond to the example modular network switch shown in FIGS. 2A and 2B. Another type of modular network switch is a 4DD modular network switch, which is shown in the figures below.

Figure 7:
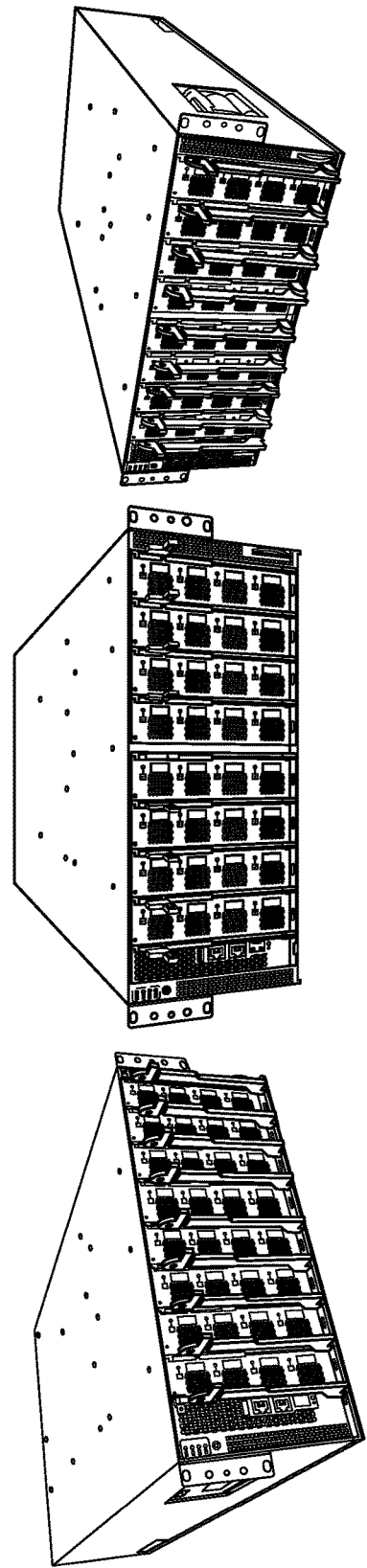
FIG. 7 is perspective view of a 4DD version of a modular network switch according to an embodiment.

FIG. 7 is perspective view of a 4DD version of a modular network switch according to an embodiment. Here, three perspective views of a modular network switch are shown. The view is of the front of the chassis, showing 8 interface modules. Each interface module supports QSFP-DD 400G.

FIG. 8 is a front view of a 4DD version of a modular network switch according to an embodiment. As shown, there are 8 interface modules: they are labeled PIM-1 (port interface module) to PIM-8. Each of the interface modules 812 have ejectors to facilitate removal. On the left side of the chassis, there is a system LED 802 to display various signals about the performance of the network switch components. For example, four tri-color system LEDs can be programmed to display status information about the system, the power distribution system, the fan, and the switch circuit board (SMB). One LED can be provided for each of the four examples listed above. System control module (SCM) 808 is configured to control the network switch, as more fully described with respect to FIG. 4.

Each side of the chassis has an air channel (air channel 804 and 806). PSU left air channel 804 and PSU right air channel 806 have perforated covers in this example. The covers cover a channel above a left PSU for cooling the left PSU corresponding to PSU-L 328 of FIG. 3 and a channel above a right PSU for cooling the right PSU corresponding to PSU-R 326 of FIG. 3. Pull tag 810 can be actuated to remove a cover of the chassis.

Figure 9A:
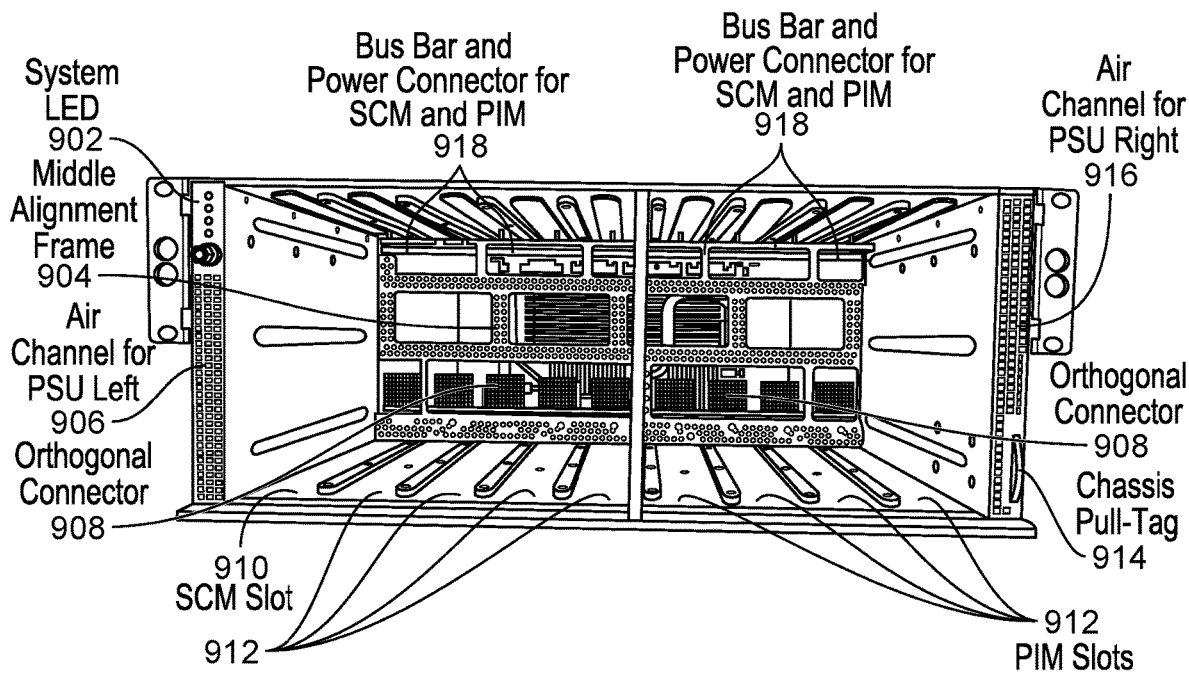
FIG. 9A is a front view of a chassis for a modular network switch according to an embodiment.

FIG. 9A is a front view of a chassis for a modular network switch according to an embodiment. The components have been removed from the chassis to more clearly illustrate what an empty chassis looks like.

The chassis can be sized based on a network rack in which the switch will be provided, the internal components, and cooling considerations, among other things. For example, the chassis can be 176 mm×440 mm×737 mm. As another example, the chassis can be 19 inches wide and four rack units high (or smaller).

The chassis includes system LED 902, which corresponds to system LED 602 and 802. The chassis also includes a middle alignment frame 904 to help orient the chassis and identify different regions inside the chassis. The middle alignment frame and other frame portions of the chassis can be made of a rigid material such as metal or plastic. For example, the material can be perforated to promote airflow through the frame. The chassis includes air channels 906 and 916, which correspond to the air channels shown in FIGS. 6 and 8. The chassis also includes orthogonal connectors 908 adapted to receive connections to the interface modules and the system control module. The chassis includes a number of parallel slots 912 to receive the system control module and interface modules. As shown, the slots are separated by a raised material defining a boundary between the slots and helping to guide the components into place inside the chassis. Once positioned in the chassis, the components are substantially retained parallel to each other. The slots include an SCM slot 910 for a system control module and 8 PIM slots 912 for the interface modules. Each of the SCM and interface modules can be individually removed from the chassis, for example, by actuating an ejector (pulling a corresponding handle or pushing a corresponding lever) and withdrawing the module form the front end.

Chassis pull-tag 914 can be actuated to remove a cover from the chassis. The chassis also includes a bus bar and power connector 918 for the system control module and interface modules.

Figure 9B:
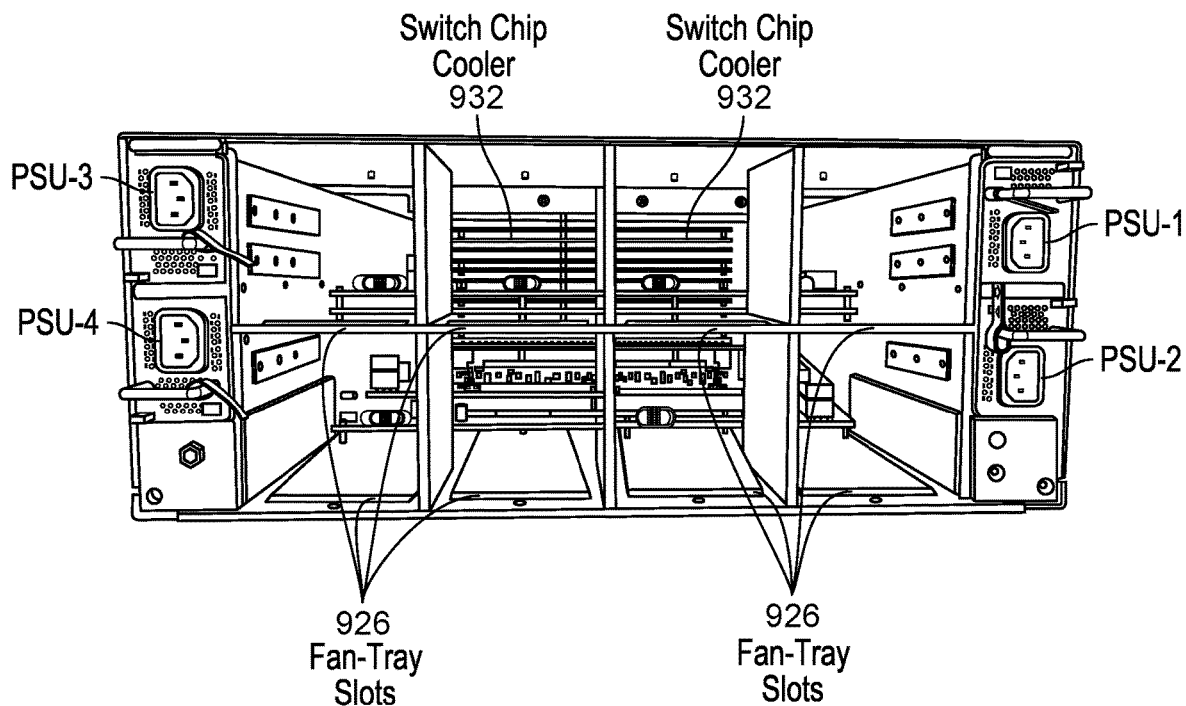
FIG. 9B is a back view of a chassis for a modular network switch according to an embodiment.

FIG. 9B is a back view of a chassis for a modular network switch according to an embodiment. In this example, there are 8 fan tray slots 926 to accommodate fans for cooling the chassis. A cooling system may include additional cooling elements such as heatsinks. In this example, a switch chip cooler 932 is provided between the fan tray slots and the front portion of the chassis. The thermal siphon heatsink may be dedicated for a switch chip or other component that tends to heat up. A cooling system and cooling mechanisms are further described in FIGS. 15-19. In this example, the chassis includes four power supply connectors PSU-1 to PSU-4 for connecting to separate power supplies. In some embodiments, the power supply connectors are power inlets including a receptacle (optionally covered by a movable cover that can be displaced) so that an appropriate connector can be connected to the receptacle to receive mains AC for each for the power units. A first power supply connector can be electrically connected to a first power unit to receive AC power for a first unit. Similarly, a second power supply connector can receive AC power for a second power unit, and so on.

The chassis shown here can be fitted with a variety of components. Some of the components that can be mounted inside the chassis are shown in the following figures.

Figure 10:
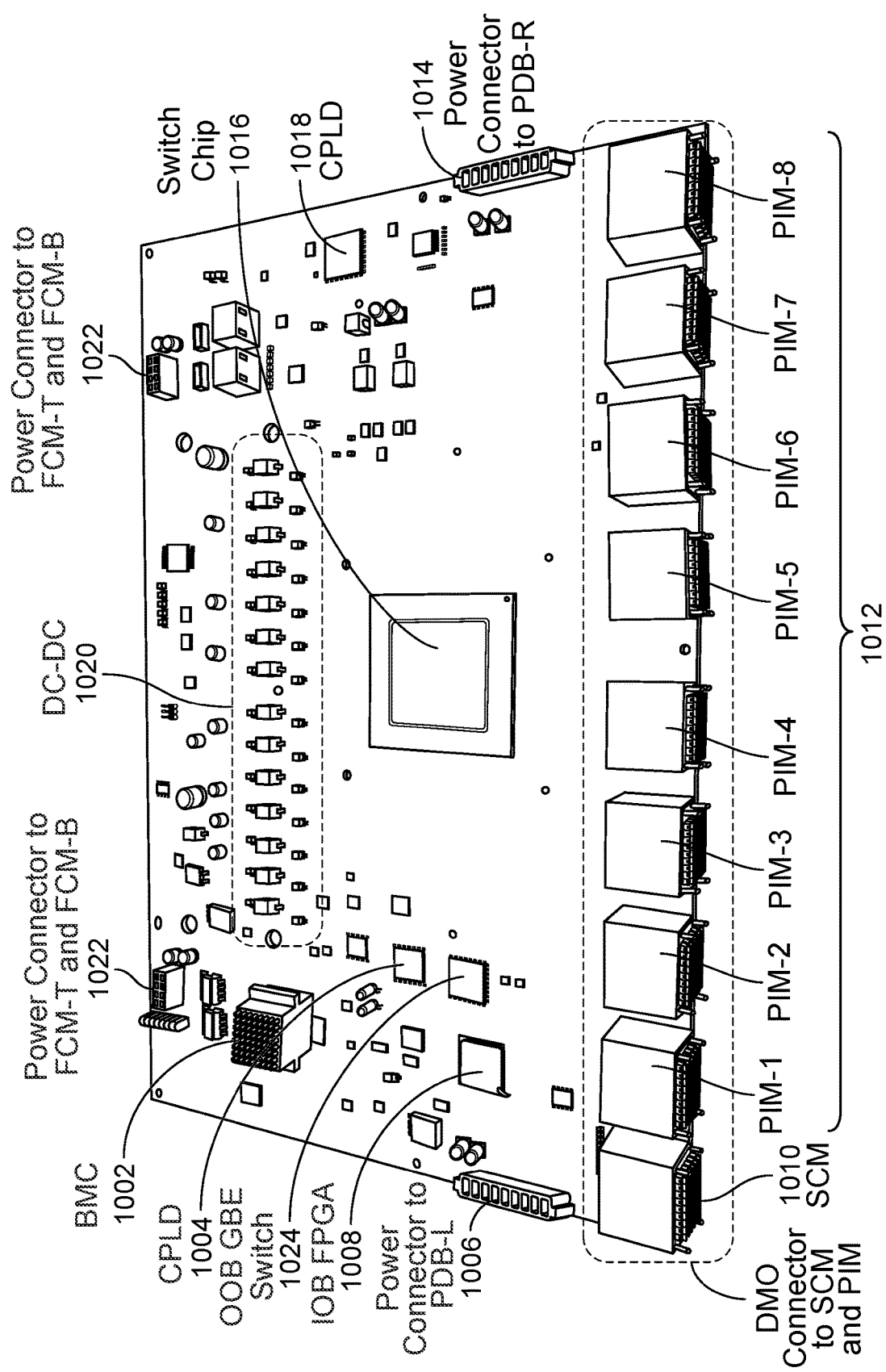
FIG. 10 is a perspective view of a switch circuit board (SMB) for a modular network switch according to an embodiment.

FIG. 10 is a perspective view of a switch circuit board (SMB) for a modular network switch according to an embodiment. The SMB can be provided in the chassis orthogonal to the interface modules in the position shown in FIG. 3A. In other words, the SMB is housed in the chassis and oriented on an orientation plane perpendicular to orientation planes of the network switch interface module circuit boards. Each of the network switch interface module circuit boards is connected to the switch circuit board via connectors 1012.

Returning to FIG. 10, the example SMB is for 4DD interface modules. The switch circuit board includes switch chip 1016, board management controller (BMC) 1002, a connector 1010 for a system control module (SCM), and connectors 1012 for interface modules. In various embodiments, the interface modules are orthogonal to the SMB, and there is no backplane dividing the SMB from the interface modules, so that cooling air passing through the chassis is not blocked by a backplane.

The switch circuit board provides data plane functions via switch chip 1016 and management plane functions via BMC 1002. Each of these components are like their counterparts in FIG. 4 unless otherwise described here. The switch circuit board includes power connectors. A power distribution system may deliver power to the SMB via several paths. Shown here is an example of separate power connectors for fan control modules (1022), left power distribution bar (PDB-L, 1006), and right power distribution bar (PDB-R, 1014). The fan control modules are split into a top FCM (FCM-T) and a bottom FCM (FCM-B) each servicing four fans (at least for this example).

The switch circuit board can include one or more complex programmable logic device (CPLD) for performing various tasks. Two example placements of CPLDs are shown here. For example, CPLD 1004 can be a SPI Mux and CPLD 1018 can be programmed to provide control and management functions.

The out-of-band gigabit (OOB GbE) switch 1024 can have a number of ports (e.g., 16 ports). The OOB GbE switch provides management plane functions. The IO bridge (JOB) FPGA 1008 bridges a CPU (e.g., a COM-e CPU of an SCM) and the interface modules. In some embodiments, the IOB FPGA is a PCIe slave device of a COM-e CPU that interfaces with eight DOM FPGA on the interface modules via a high speed control interface to allow the IOB FPGA to access DOM FPGA, gearbox, and QSFP28 optic module on the interface modules. The DC-DC converter 1020 provides an appropriate DC supply to board components. The DC-DC converter can be a 14 phase 400A converter, for example.

Another component that can be fitted in a chassis for a network switch is a system control module. The following figures show an example of a system control module.

Figure 11:
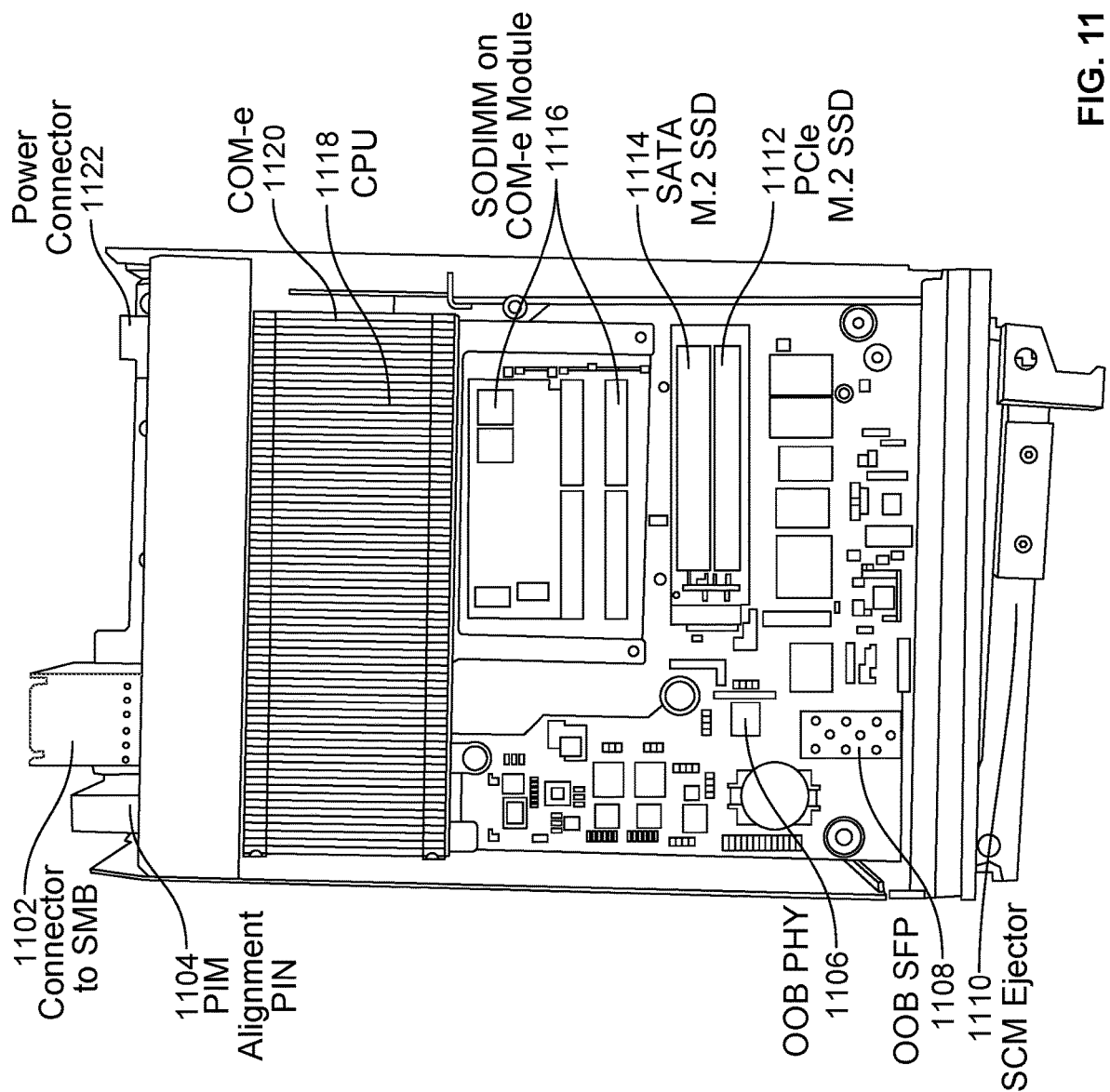
FIG. 11 is a top-down view of a system control module (SCM) for a modular network switch according to an embodiment.

FIG. 11 is a top-down view of a system control module (SCM) for a modular network switch according to an embodiment. The system control modules includes a connector 1102, an alignment PIN 1104, an ejector 1110, a power connector 1122, a COM-express CPU 1120, memory 1112/1114.

Connector 1102 is adapted to connect the SCM to a system circuit board (SMB). For example, the connector can be a direct mate orthogonal (DMO) connector. Alignment pin 1104 is adapted to help align the control module to the chassis. For example, the protruding pin fits into a corresponding cavity on the chassis. Ejector 1110 is a mechanism that can be pulled or pushed to release and remove the SCM from the chassis. Power connector 1122 is adapted to connect to a power distribution bar to receive power for the SCM. An example of a power connector that can be used is a CoolPower® power connector. SCM includes a COM-express CPU 1120 for managing the SCM.

SCM can include additional optional components to assist management such as OOB PHY 1106, OOB SFP 1108, and CPU 1118. Example storage devices 1112, 1114 and 1116 are also shown.

Figure 12:
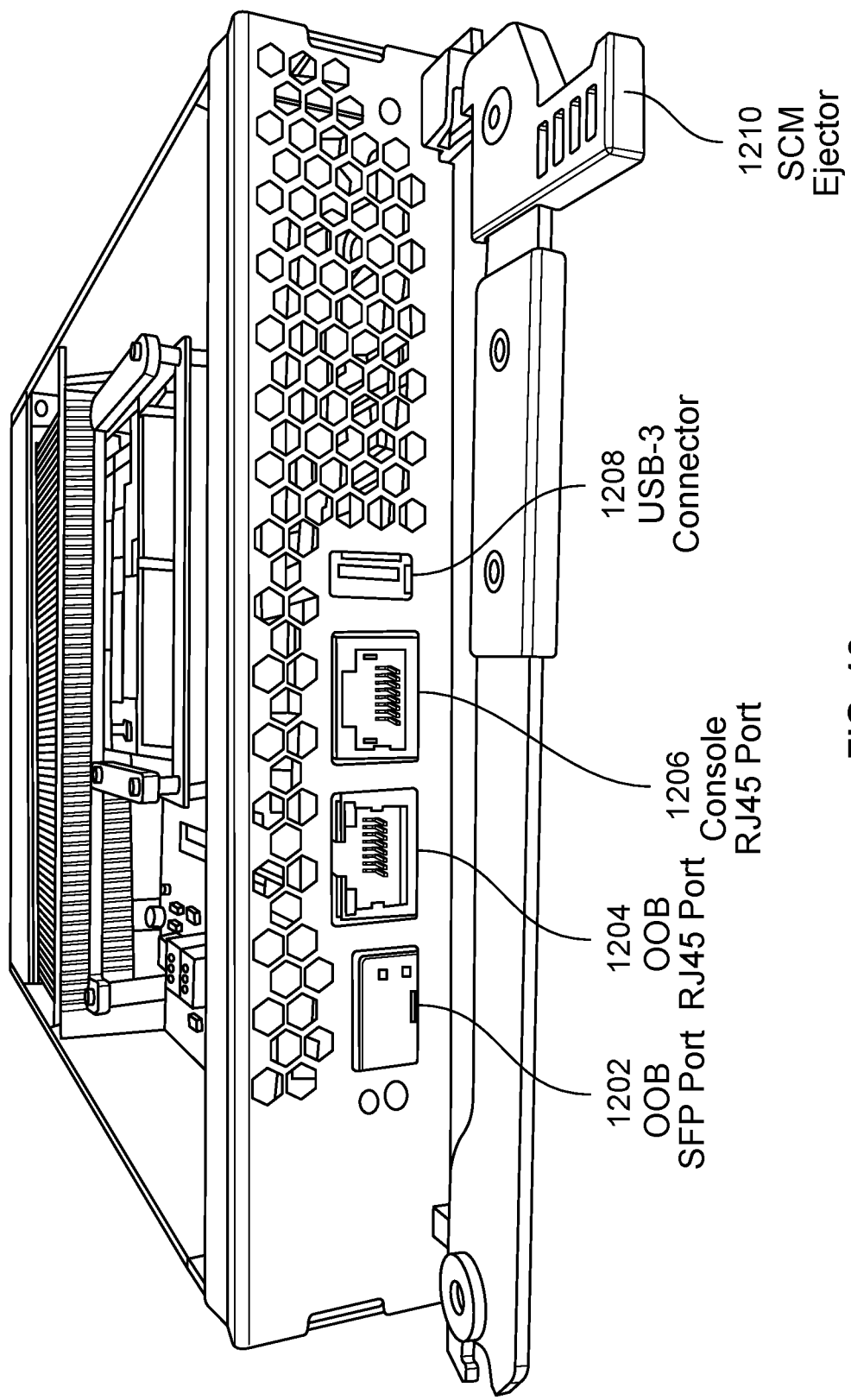
FIG. 12 is a perspective view of a system control module (SCM) for a modular network switch according to an embodiment.

FIG. 12 is a perspective view of a system control module (SCM) for a modular network switch according to an embodiment. The SCM can be installed in a chassis parallel to the interface modules as shown in FIG. 2A for example. The SCM can have a number of ports as shown. These ports (OOB SFP 1202, OOB RJ45 1204, Console RJ45 1206, USB-3 1208) provide a variety of functions including debug, data download/upload, and other communications. SCM ejector 1210 is a mechanism for releasing and removing the SCM from the chassis.

The example components discussed above (e.g., SMB, SCM, and interface modules) tend to generate heat inside the chassis. The chassis can be cooled according to the techniques described below to improve the functioning of the network switch. For example, overheating is prevented and the operating environment of the network switch can be maintained at an optimal temperature to maximize efficiency and performance of the network switch. The following figures show examples of cooling components for cooling the network switch.

Figure 13:
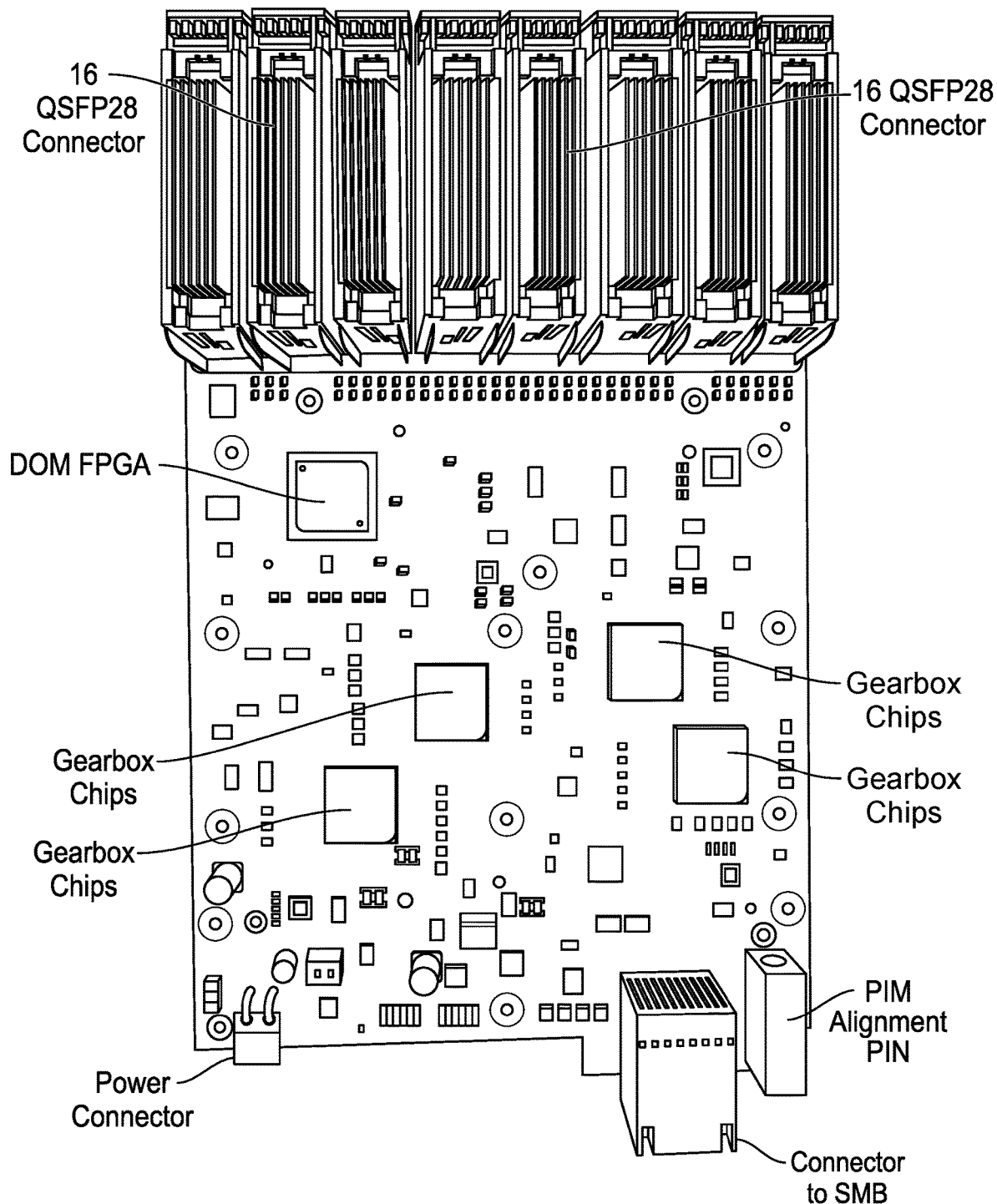
FIG. 13 is a top-down view of a 16Q network switch interface module for a modular network switch according to an embodiment.

FIG. 13 is a top-down view of a 16Q network switch interface module for a modular network switch according to an embodiment. The interface module includes a port for receiving data from an external device in a network and at least one application-specific integrated circuit (ASIC) for data forwarding (e.g., gearbox). Here, the interface module is for a 16Q network switch, so it includes 16 QSFP28 connectors for respective optical transceivers. Four example gearbox chips are shown. A power connector for connecting to a power distribution bar is provided at an edge of the board. A PIM alignment pin helps to align the interface module to its location in the chassis. Also shown is a DMO connector for connecting to a switch circuit board (SMB).

A plurality of these interface modules can be installed in a chassis. They may each be arranged horizontally in the front portion of the chassis parallel to each other. Each may have one or more ejectors for installing and retaining the interface module in position in the chassis, and later removing the interface module.

Figure 14:
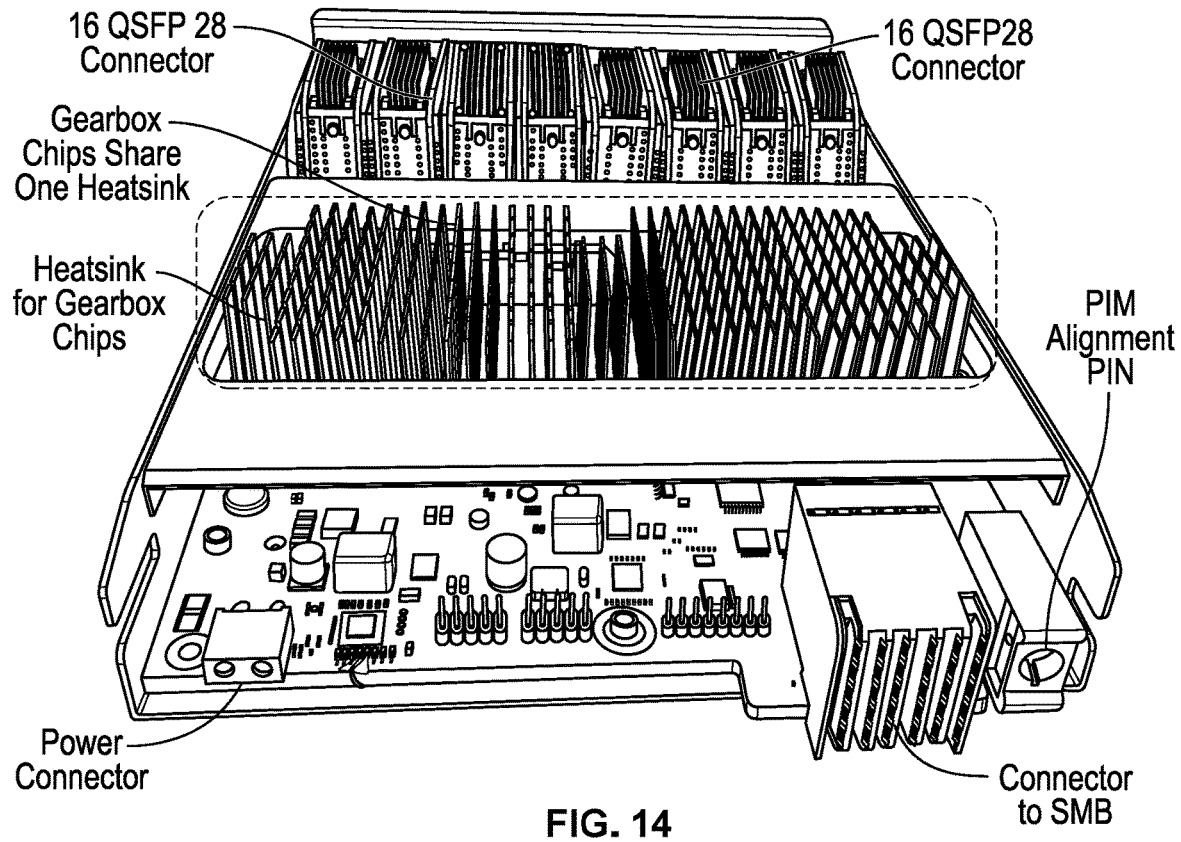
FIG. 14 is a perspective view of a 16Q network switch interface module circuit boards (PIM) for a modular network switch according to an embodiment.

FIG. 14 is a perspective view of a 16Q network switch interface module circuit boards (PIM) for a modular network switch according to an embodiment. This view better illustrates a heatsink for cooling the gearbox chips. For example, a heatsink may be dedicated for cooling a plurality of gearbox chips.

Figure 15:
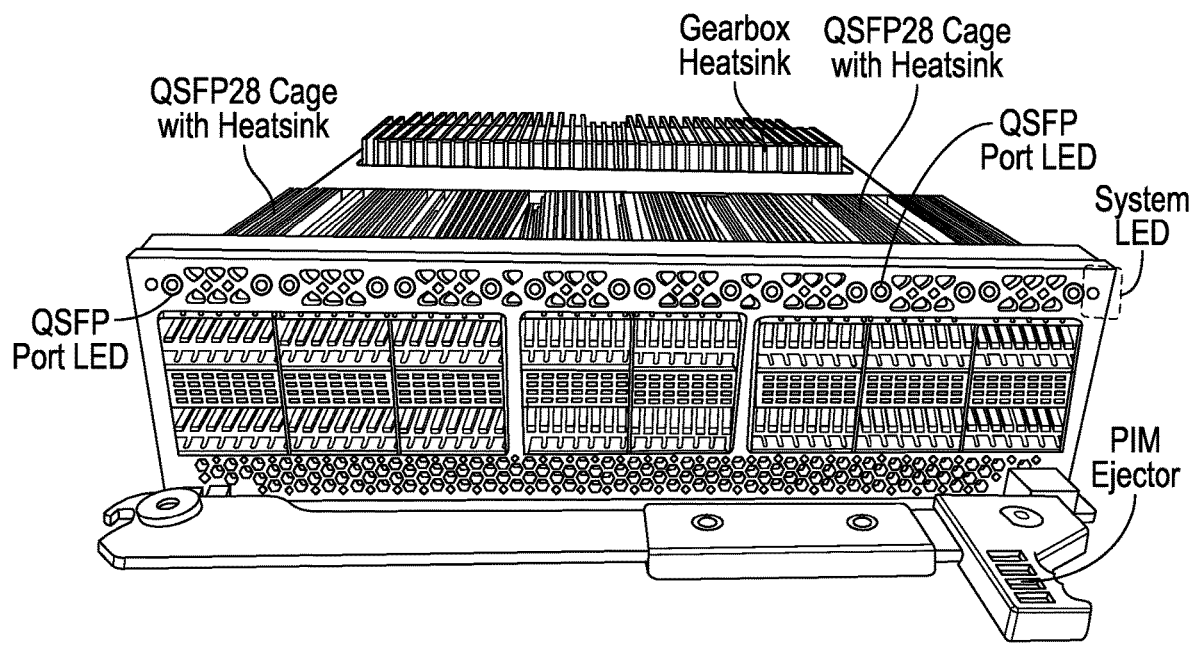
FIG. 15 is a perspective view of a 16Q network switch interface module circuit boards (PIM) for a modular network switch according to an embodiment.

FIG. 15 is a perspective view of a 16Q network switch interface module circuit boards (PIM) for a modular network switch according to an embodiment. This view better illustrates the 16 ports for receiving optical transceivers and the ejector.

As described with respect to FIGS. 5 and 6, one type of modular network switch is a 16Q network switch. Another type of modular network switch is a 4DD modular network switch. A PIM for a 4DD modular network switch is illustrated in the following figures.

Figure 16:
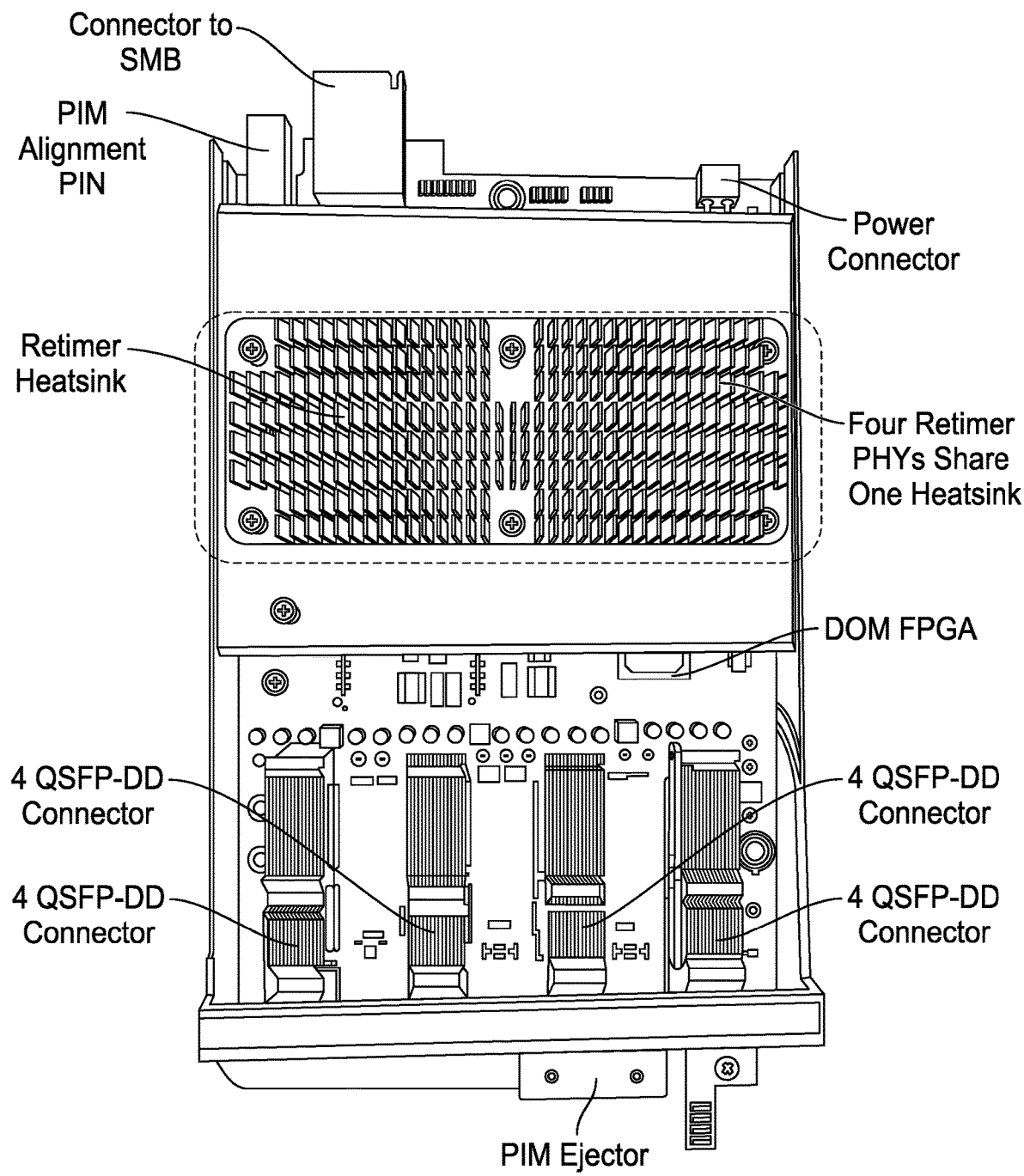
FIG. 16 is a top-down view of a 4DD network switch interface module circuit boards (PIM) for a modular network switch according to an embodiment.
Figure 17:
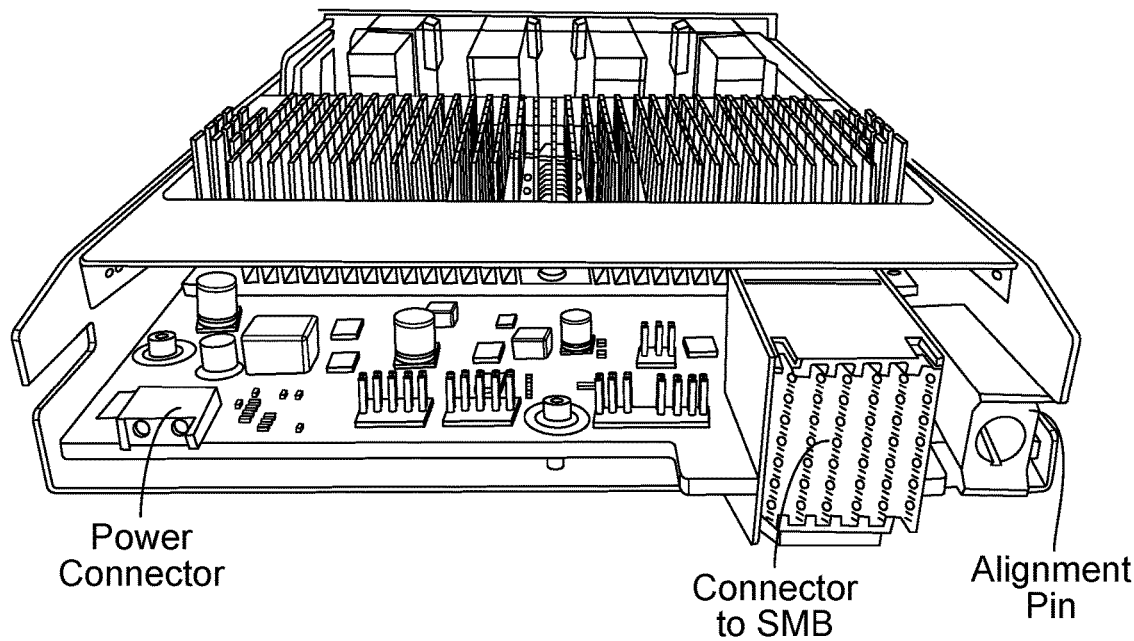
FIG. 17 is a perspective view of a 4DD network switch interface module circuit boards (PIM) for a modular network switch according to an embodiment.
Figure 18:
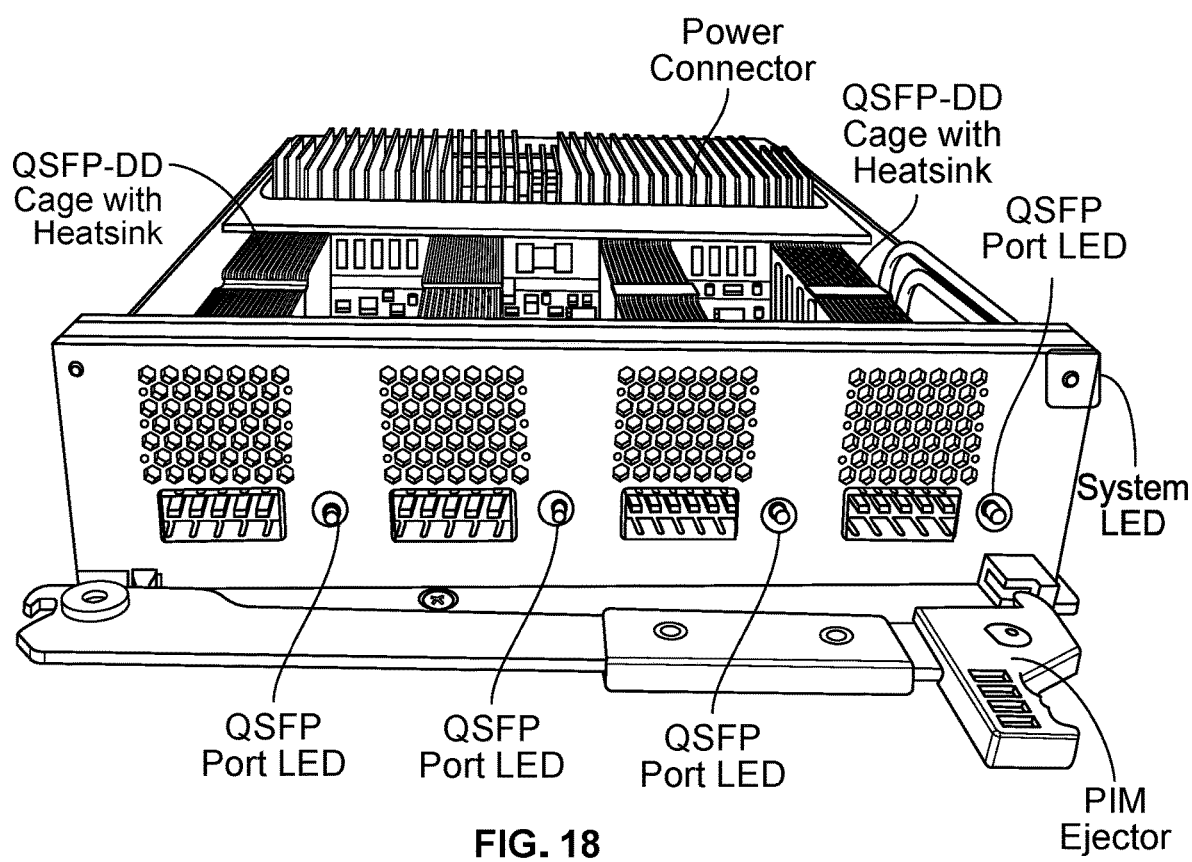
FIG. 18 is a perspective view of a 4DD network switch interface module circuit boards (PIM) for a modular network switch according to an embodiment.

FIG. 16 is a top-down view of a 4DD network switch interface module circuit boards (PIM) for a modular network switch according to an embodiment. FIG. 17 is a perspective view of a 4DD network switch interface module circuit boards (PIM) for a modular network switch according to an embodiment. FIG. 18 is a perspective view of a 4DD network switch interface module circuit boards (PIM) for a modular network switch according to an embodiment. The components of the 4DD interface module are like the ones in the 16Q interface module described above with the exception of the connectors. Here, there are 4 QSFP-DD connectors. PIM ejector can be pulled or pushed to eject the interface module from the chassis.

FIG. 19 is a back view of a modular network switch showing example locations of cooling components and power supplies according to an embodiment. The modular network switch shown here corresponds to the one shown in FIG. 2B. The device chassis houses one or more fans. Here, there are 8 fans, FAN-1 to FAN-8. The fan units, along with possibly other cooling components, provide cooling for the modular network switch to improve the performance of the network switch by maintaining an optimal operating temperature (or range) for the interface modules, interface module circuit board, switch circuit, board, switch chips, and other devices of the modular network switch. The fan trays can be sized based on a chassis size, and quantity of cooling to be provided, among other things. For example, a fan tray can be 80 mm square. In this example, the chassis includes four power supply connectors PSU-1 to PSU-4 for connecting to separate power supplies. The power supplies are like those described in FIG. 9B.

Power consumption can be decreased using a fan system like the one described here. Power consumption is exponentially related to fan speed. Thus, running a single fan at a higher speed typically consumes more power than running two (or possibly more) fans at lower speeds. In this example, 8 fans are provided to provide cooling. Collectively, they consume less power because, in various embodiments, each fan is operated at less than 50% of the duty cycle. This also prolongs the life of the fan.

Figure 20:
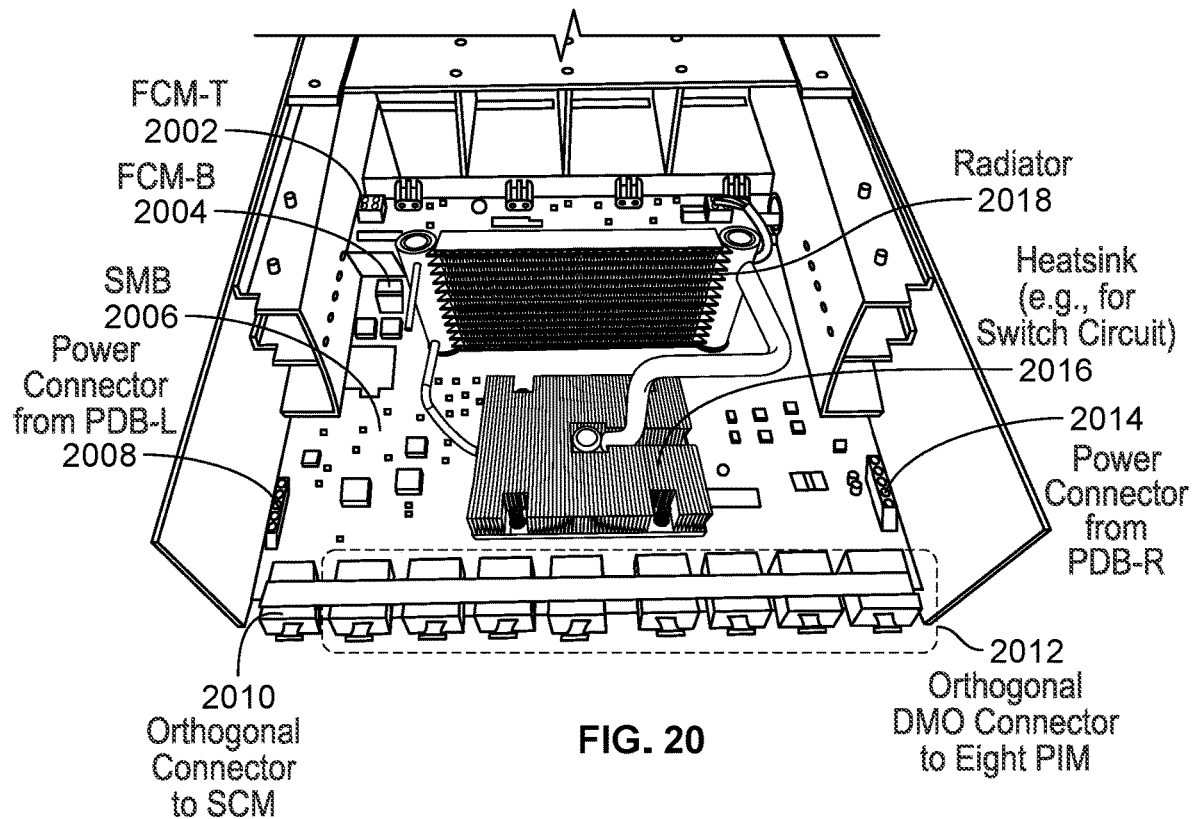
FIG. 20 is a perspective view of a modular network switch including cooling components according to an embodiment.

FIG. 20 is a perspective view of a modular network switch including cooling components according to an embodiment. This example illustrates one type of cooling mechanism—a heatsink with thermal siphon 2016—which is provided over the switch chip to cool the switch chip. The heatsink absorbs heat generated by the switch chip, and the heat is conducted by thermal siphon 2016 to radiator 2018. In some embodiments, an evaporator module coupled to a radiator helps to dissipate heat. Fan(s) promote airflow in the chassis to then move the heat outside the chassis. Other components are also shown here to provide context for the cooling element. These components function like their counterparts described in the other figures.

Figure 21:
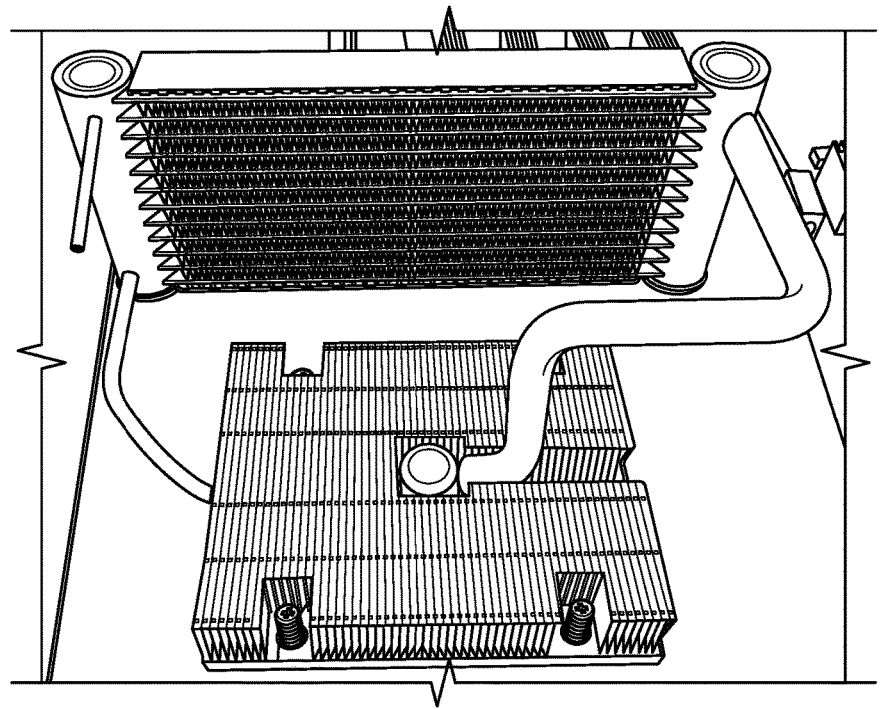
FIG. 21 is a perspective view of a cooling component for a modular network switch according to an embodiment.

FIG. 21 is a perspective view of a cooling component for a modular network switch according to an embodiment. This is a close-up view of the thermal siphon and heatsink.

Figure 22:
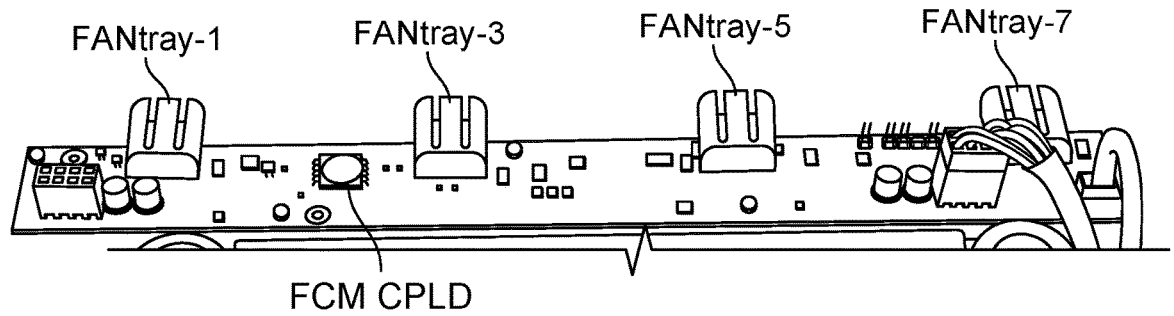
FIG. 22 is a perspective view of fan trays of a modular network switch according to an embodiment.
Figure 23:
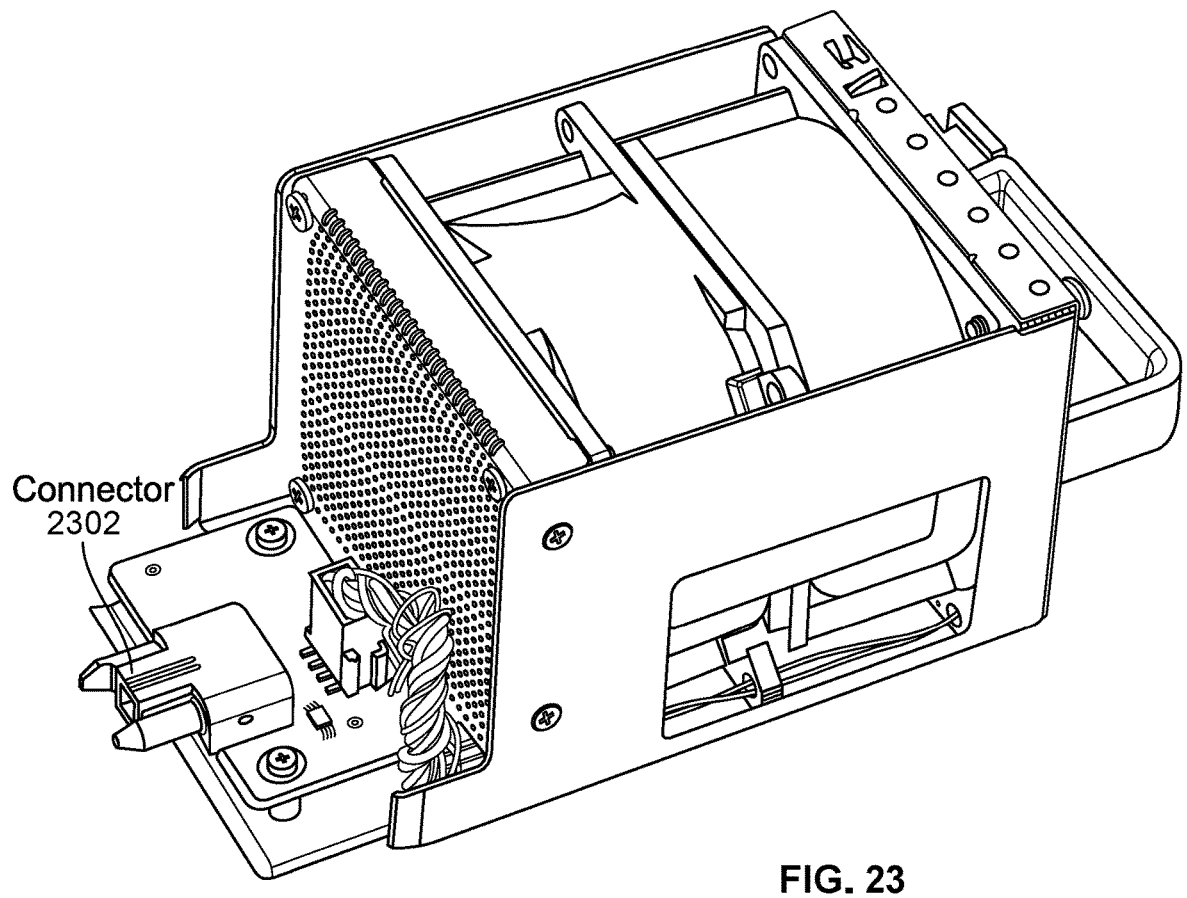
FIG. 23 shows an example fan for a modular network switch.

FIG. 22 is a perspective view of fan trays of a modular network switch according to an embodiment. This view shows the connectors for the fan trays. Referring to FIG. 20, these connectors are situated on a side of the radiator 2018 opposite the heatsink 2016. Returning to FIG. 22, there is a connector for each of the four fans that form a row of fans. In some embodiments, a chassis includes two rows of fans, each row including four fans for example. Also shown is a fan control module (FCM) CPLD, which is programmed to control the fans such as fan speed. In some embodiments, each fan is operated at no more than 50% duty cycle. For example, the FCM CPLD is communicatively coupled to an SMB, and receives instructions to operate or cease operation of the fans. For example, temperature readings made by the temperature sensors in the front and rear of the chassis are reported to the SMB, the SMB determines that one region requires cooling, and instructs corresponding fans to operate to promote airflow and cooling through that region of the chassis. FIG. 23 shows an example fan for a modular network switch. The fan has a connector 2302 for plugging into the corresponding connectors shown in FIG. 22. The fan can also include a handle to facilitate handling, e.g., installation and removal of the fan into the chassis.

In some embodiments, power is distributed throughout the network switch in a way that facilitates cooling or temperature control. The following figures show examples of a power distribution network for a network switch.

Figure 24:
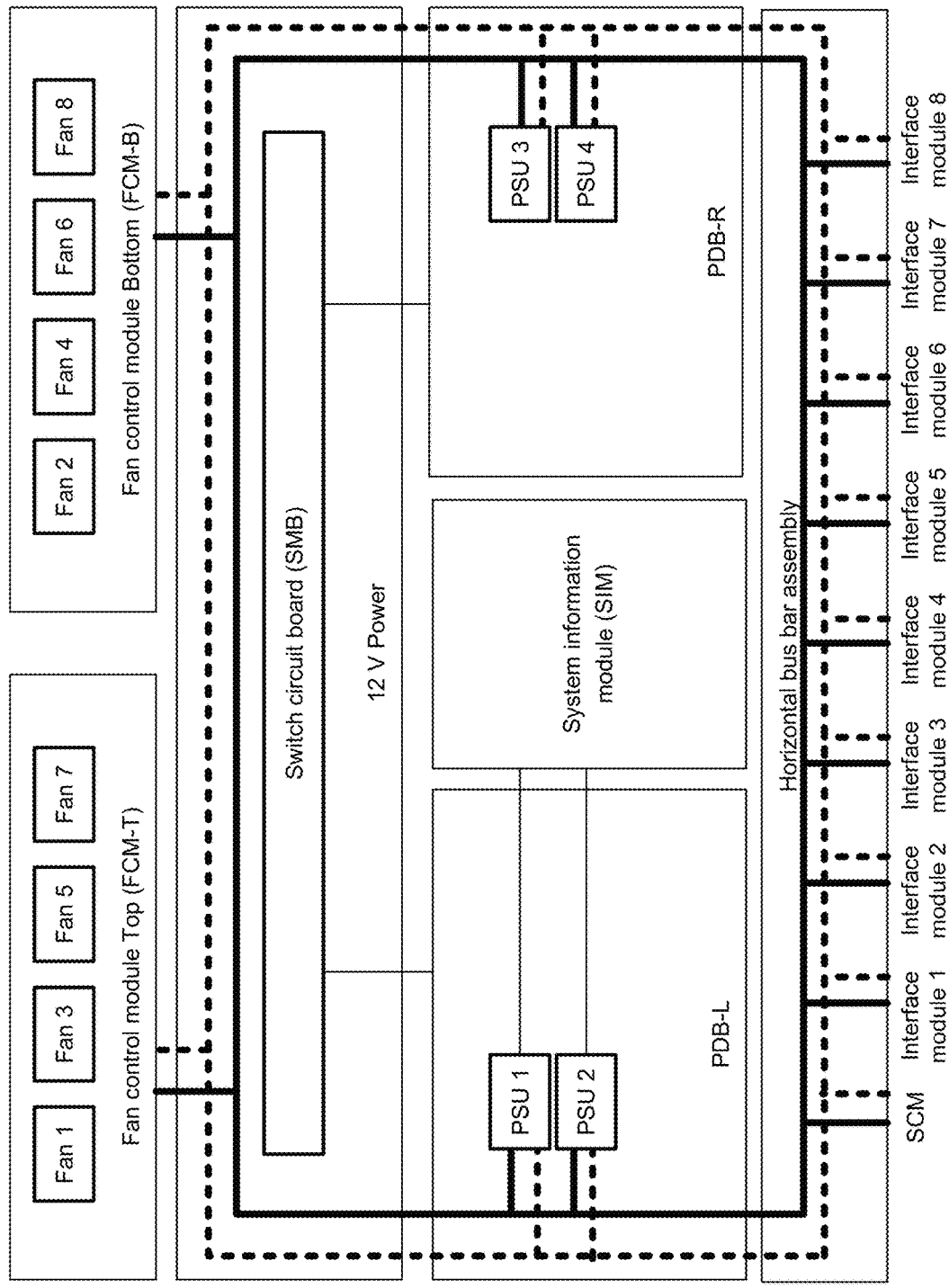
FIG. 24 is a block diagram illustrating an embodiment of a power distribution network for a modular network switch.

FIG. 24 is a block diagram illustrating an embodiment of a power distribution network for a modular network switch. This block diagram corresponds to FIG. 3B. In this example, there are four power supply units (PSU-1 to PSU-4), a left power distribution bar (PDB-L), a right power distribution bar (PDB-R), and a horizontal bus bar. In some embodiments, the horizontal bus bar assembly does not include PCB material. Two of the power supplies, PSU-1 and PSU-2 are associated with PDB-L and two of the power supplies, PSU-3 and PSU-4, are associated with PDB-R.

In some embodiments, one or more power supplies provide power to the interface modules via a power bus bar, and one or more power supplies (which may be different form the ones providing power to the interface modules) provide power to the switch circuit board via a connection separate from the power bus bar.

As shown, power is delivered in a redundant manner to each of the components including the fan units, the interface modules, and the system control module. For example, PSU-1 and PSU-3 are redundant. In some embodiments, a first power supply is provided on a first side of the chassis and a redundant power supply is provided on a second side of the chassis. This means that even if two of the four units fail, every component in the network switch is still powered.

The previous figure shows an example block diagram of a power distribution network. The following figure shows an example form factor corresponding to the block diagram.

Figure 25:
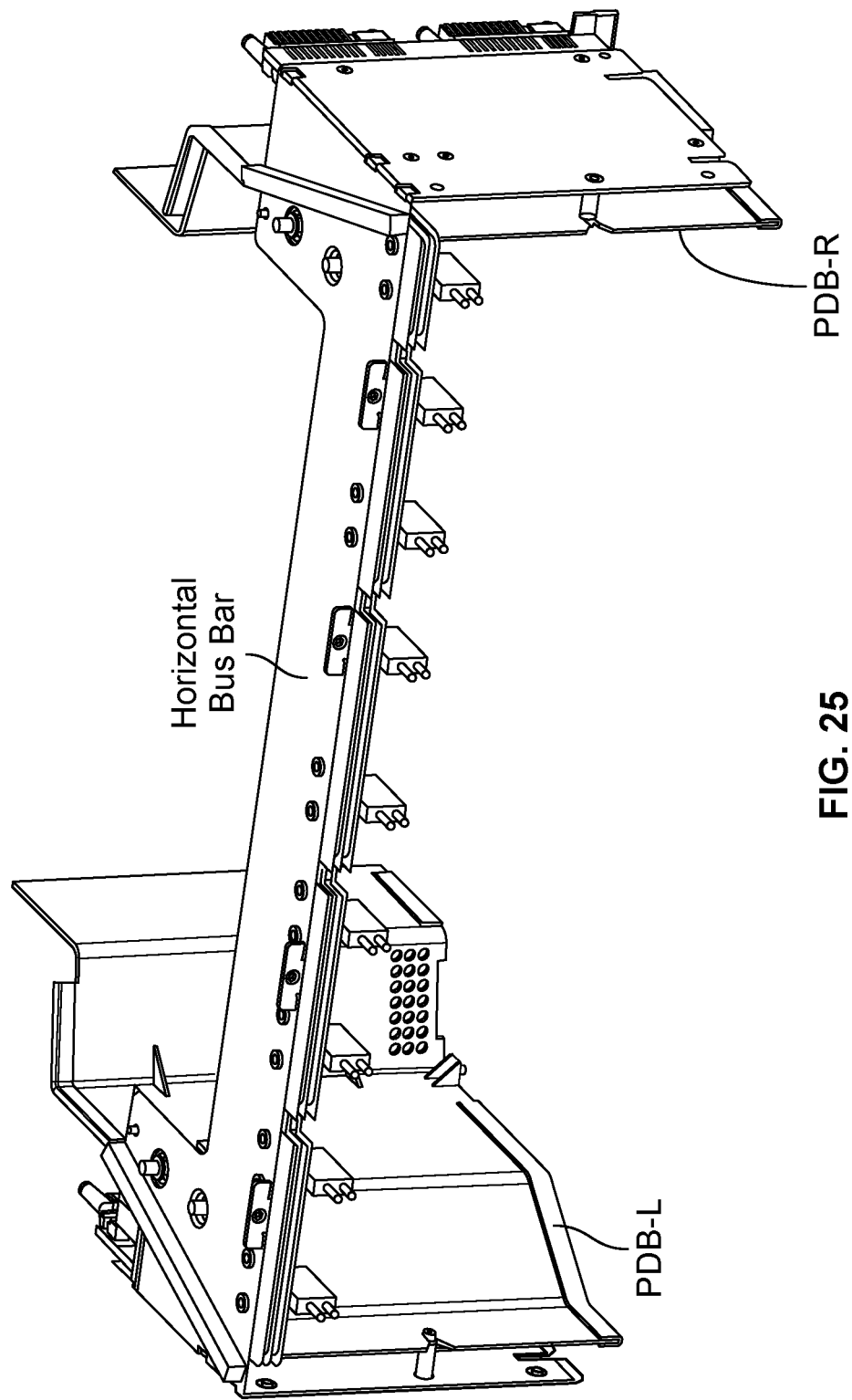
FIG. 25 is a perspective view of a power distribution bus bar assembly for a modular network switch according to an embodiment.

FIG. 25 is a perspective view of a power distribution bus bar assembly for a modular network switch according to an embodiment. This is an example of bus bar assembly that is installed over the SMB. One end of the power bus bar (e.g., PDB-L) is installed on one side of the SMB and the other end of the power bus bar (e.g., PDB-R) is installed on an opposite side of the SMB. PDB-L and PDB-R are connected by a horizontal bus bar to form a power distribution bus bar assembly. The power distribution bus bar assembly may be installed such that power bus bar assembly passes over the SMB like a bridge, the longitudinal axis of the power bus bar assembly being orthogonal to the longitudinal axis of the SMB. In other words, the horizontal bus bar traverses over and on top of one or more components of the SMB. The power bus bar includes a left portion parallel to one wall of the chassis and a right portion parallel to an opposite wall of the chassis. The left and right portions are connected by a horizontal bus bar. In various embodiments, the horizontal bus is a two layer bus bar assembly made of a metal material such as copper. PDB-L and PDB-R may each include PCB components.

Figure 26A:
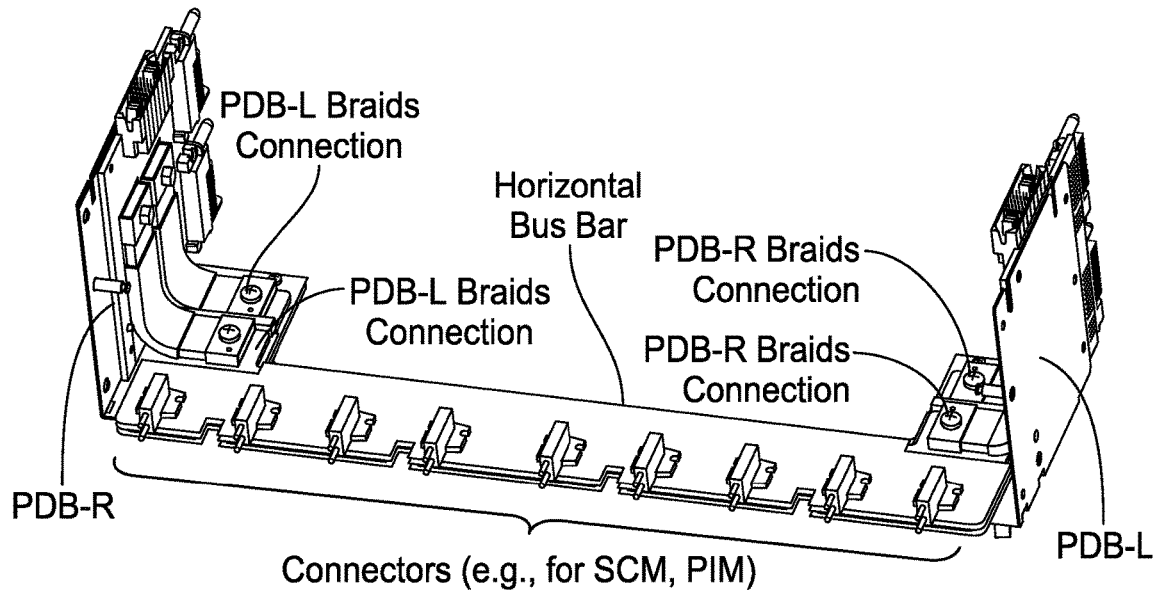
FIG. 26A is a top-down perspective view of a power bus bar corresponding to the embodiment shown in FIG. 25.
Figure 26B:
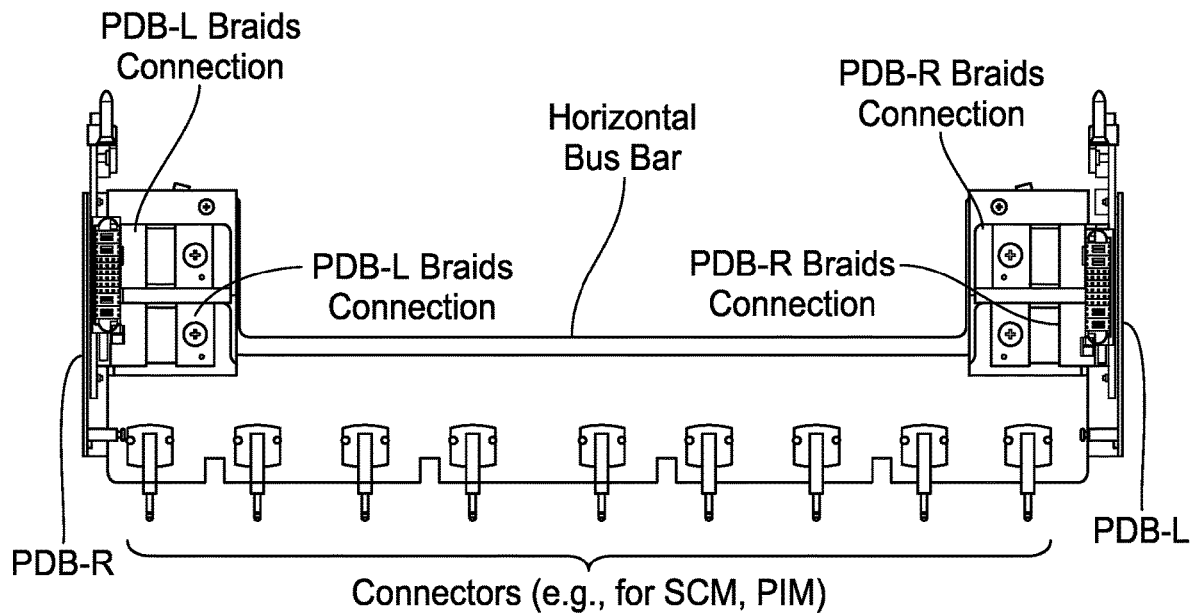
FIG. 26B is a top-down view of a power bus bar corresponding to the embodiment shown in FIG. 25.

FIG. 26A is a top-down perspective view of a power bus bar corresponding to the embodiment shown in FIG. 25. FIG. 26B is a top-down view of a power bus bar corresponding to the embodiment shown in FIG. 25. FIGS. 26A and 26B show an underside of the power bus bar. The power bus bar includes several connectors for connecting to interface modules. In some embodiments, power is delivered to the components such as the system control module and the interface modules via CoolPower® connectors. That is, power is provided to the SMB via a connection separate from the power bus bar. PDB-L/R can be connected to a horizontal bus bar assembly via a flexible braided power connector, here PDB-L and PDB-R braids connection.

A variety of power supply units (PSU) can be used to implement the power distribution network. The following figures show examples of PSUs that can be included in the power distribution network.

Figure 27:
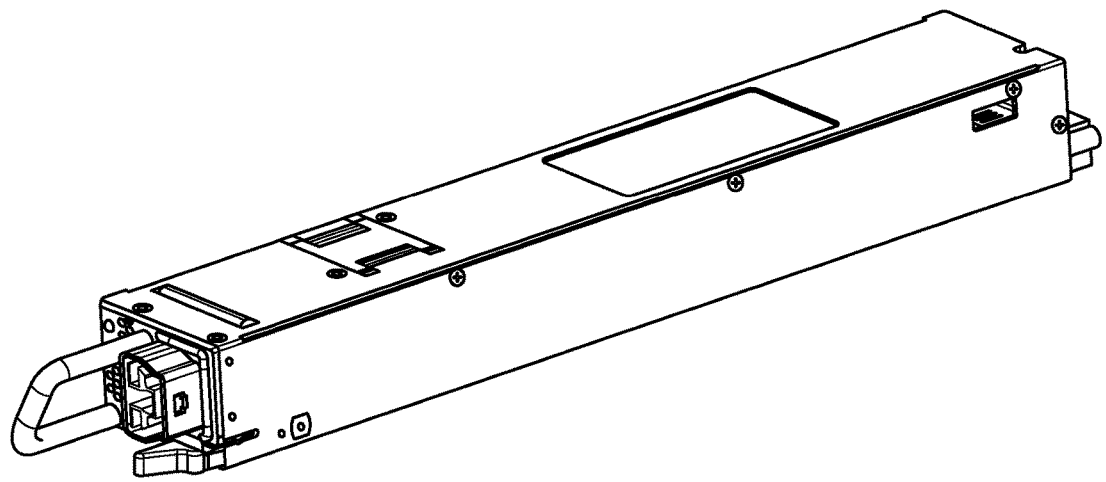
FIG. 27 shows an example power supply unit (PSU) for a modular network switch.

FIG. 27 shows an example power supply unit (PSU) for a modular network switch. This is an example of one of the power supply units shown in FIG. 3B. The PSU can be removably installed in the chassis. The power units are adapted to convert AC power to DC power such as low-voltage regulated DC for used by the switch components (e.g., interface modules and system control module). Each of the power supply units can be individually removed from the chassis by pulling on a corresponding handle to withdraw the power unit from the chassis.

Figure 28:
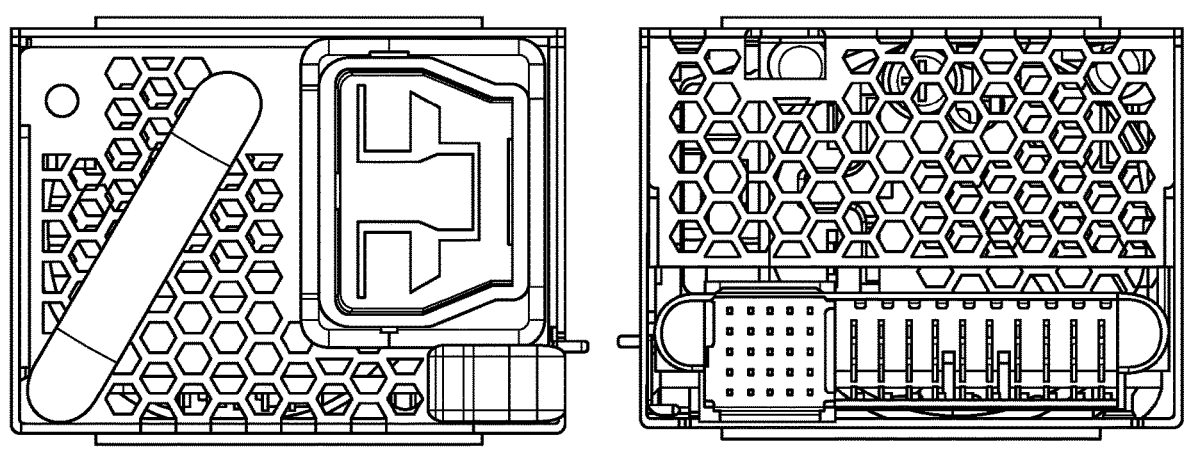
FIG. 28 is a side view of the example power supply unit (PSU) shown in FIG. 27.

FIG. 28 is a side view of the example power supply unit (PSU) shown in FIG. 27. On one end, an example handle and connector is shown. On the other end, and example of a perforated covering to promote airflow and cooling is shown.

Figure 29:
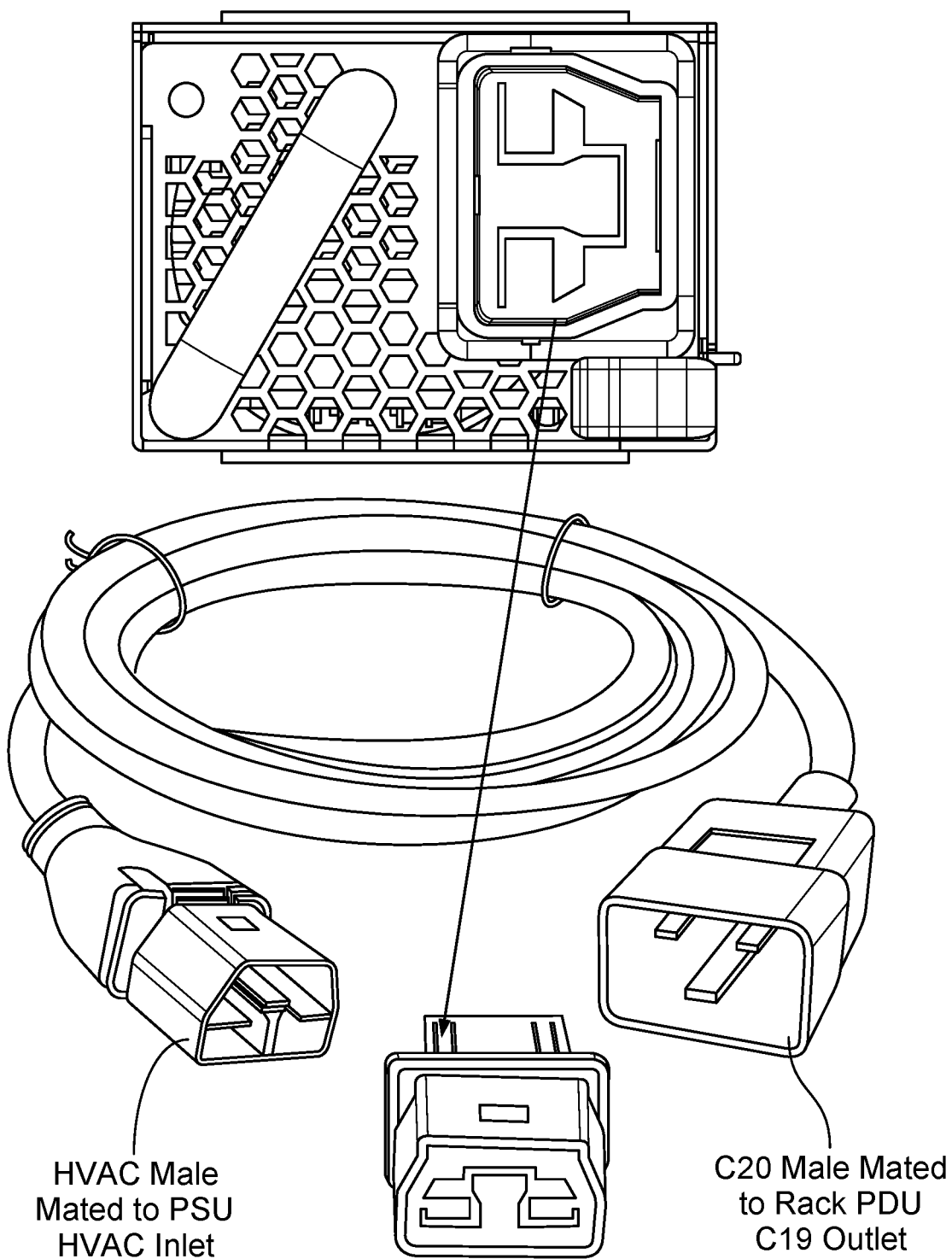
FIG. 29 shows a connector for the example power supply unit (PSU) shown in FIG. 27.

FIG. 29 shows a connector for the example power supply unit (PSU) shown in FIG. 27. In this example, the connector is a high voltage alternating current (HVAC) connector (e.g., an Anderson connector). The ends can be adapted to the receiving connectors. For example, here one end is a HVAC male pated to PSU HVAC inlet and the other end is a C20 male mated to rack PDU C19 outlet.

The network switch described here has many advantages. In one aspect, the network switch has one or more field replaceable components including the system control module and the interface modules. The network switch has a disaggregated architecture, so each interface module or system control module can be removed and replaced without disturbing the functioning of the system. The network switch has an orthogonal direct chassis architecture in which interface modules are mated orthogonally, opening more space for air to flow through. Thermal performance is improved and PCB trace length is reduced for better signal integrity. The thermal design supports low cost optical cabling, connectors, and transceivers.

Although the foregoing embodiments have been described in some detail for purposes of clarity of understanding, the invention is not limited to the details provided. There are many alternative ways of implementing the invention. The disclosed embodiments are illustrative and not restrictive.

The invention claimed is:
1. A system comprising:
  a device chassis including:
    a first airflow region,
    a second airflow region, and
    a first airflow divider separating the first airflow region and the second airflow region;
  a plurality of removable network switch interface modules housed in the first airflow region of the device chassis, wherein each of the removable network switch interface modules includes a network switch interface module circuit board that is positioned in parallel with other network switch interface module circuit boards of the removable network switch interface modules housed in the device chassis;
  a switch circuit board housed in the first airflow region of the device chassis downstream of the network switch interface module circuit boards, the switch circuit board oriented in an orientation plane perpendicular to orientation planes of the network switch interface module circuit boards, wherein each of the network switch interface module circuit boards is connected to the switch circuit board;
  a switch chip electrically connected to the switch circuit board, housed in the first airflow region of the device chassis downstream of the network switch interface module circuit boards, and configured to switch net- work traffic between network connections of the plurality of removable network switch interface modules;

a power bus bar including two ends each adapted to electrically couple to a power component, the two ends being connected by a bridge portion spanning over the switch circuit board, wherein the bridge portion is housed in the first airflow region of the device chassis and is adapted to electrically couple to the removable network switch interface modules, and a first end of the two ends of the power bus bar is housed in the second airflow region of the device chassis;

a plurality of intake vents for the first airflow region, each of the intake vents corresponding to at least one of the removable network switch interface modules;

at least one intake vent for the second airflow region that is different than the plurality of intake vents for the first airflow region; and a thermal component provided over the switch chip housed in the first airflow region of the device chassis.

2. The system of claim 1, further comprising a removable system control module housed in the device chassis.

3. The system of claim 2, wherein the removable system control module includes a processor circuit board that is positioned in parallel with the network switch interface module circuit boards of the removable network switch interface modules housed in the device chassis.

4. The system of claim 1, wherein the power component electrically coupled to the first end of the power bus bar comprises at least one modular and removable power supply provided in the second airflow region.

5. The system of claim 1, further comprising a plurality of modular and removable fans.

6. The system of claim 1, wherein the network switch interface module circuit board for at least one module of the removable network switch interface modules includes a gearbox network physical layer function chip configured to at least one of: convert signaling format, re-time, amplify, encrypt, or decrypt signals.

7. The system of claim 1, wherein one or more of the network switch interface module circuit boards includes a plurality of optical transceiver receiver connectors.

8. The system of claim 1, wherein a number of the removable network switch interface modules is at least eight.

9. The system of claim 1, wherein the device chassis has a third airflow region separated from the first airflow region by a second airflow divider, and a second end of the two ends of the power bus bar is housed in the third airflow region of the device chassis.

10. The system of claim 9, wherein the power component electrically coupled to the second end of the power bus bar comprises at least one second power supply housed in the third airflow region of the device chassis.

11. The system of claim 1, further comprising a plurality of fans each adapted to provide forced air cooling within the device chassis.

12. The system of claim 1, further comprising at least one fan configured to move cooling air into the device chassis through a front side of the device chassis, then over the network switch interface modules, and then out of the device chassis through a back side of the device chassis.

13. The system of claim 1, wherein the plurality of removable network switch interface modules are oriented substantially parallel to a direction of airflow and are electrically connected such that the airflow is unimpeded by a midplane or a backplane.

14. The system of claim 1, wherein the thermal component includes (i) a heat absorbing portion configured to absorb heat from the switch chip and (ii) a heat releasing portion configured to release the heat into the first airflow region downstream of the switch chip.

15. The system of claim 14, wherein the thermal component includes a thermal siphon heatsink, the heat absorbing portion includes an evaporator module, and the heat releasing portion includes a radiator coupled to the evaporator module and downstream of the evaporator module.

* * * * *